US011520479B2

(12) United States Patent
Lerner et al.

(10) Patent No.: US 11,520,479 B2
(45) Date of Patent: Dec. 6, 2022

(54) MASS MEDIA PRESENTATIONS WITH SYNCHRONIZED AUDIO REACTIONS

(71) Applicant: PIQPIQ, INC., San Francisco, CA (US)

(72) Inventors: Edward Adam Lerner, San Francisco, CA (US); David Leroy Futscher, Oakland, CA (US); James C. Allen, San Francisco, CA (US)

(73) Assignee: PIQPIQ, INC., San Francisco, CA (US)

( * ) Notice: Subject to any disclaimer, the term of this patent is extended or adjusted under 35 U.S.C. 154(b) by 405 days.

(21) Appl. No.: 16/833,629

(22) Filed: Mar. 29, 2020

(65) Prior Publication Data

US 2020/0225844 A1    Jul. 16, 2020

Related U.S. Application Data

(63) Continuation of application No. 15/691,639, filed on Aug. 30, 2017, now abandoned.
(Continued)

(51) Int. Cl.
*G06F 3/04883* (2022.01)
*G06F 3/0485* (2022.01)
(Continued)

(52) U.S. Cl.
CPC ........ *G06F 3/04883* (2013.01); *G06F 3/0482* (2013.01); *G06F 3/0485* (2013.01);
(Continued)

(58) Field of Classification Search
None
See application file for complete search history.

(56) References Cited

U.S. PATENT DOCUMENTS

| 5,864,868 A | 1/1999 | Contois |
| 8,406,439 B1 * | 3/2013 | Bedingfield, Sr. ........................... H04L 12/1827 381/310 |

(Continued)

FOREIGN PATENT DOCUMENTS

CA    WO-2016000069 A1 *    1/2016    ............. G06Q 10/10

*Primary Examiner* — Duc Nguyen
*Assistant Examiner* — Assad Mohammed
(74) *Attorney, Agent, or Firm* — Brian E. Hennessey; Liang & Hennessey LLP

(57) ABSTRACT

Systems and methods of the present disclosure provide a plurality of audio reactions from a plurality of client devices. The audio reactions are captured by microphones on the client devices and are time-stamped. The method also includes mixing the audio reactions by a mixer server to form a mixed audio reaction, and sending the mixed audio reaction to at least one of the client devices. The client device is adapted to play the mixed audio reaction and a mass media presentation. The mixed audio reaction and the mass media presentation are synchronized to create an audience effect for the mass media presentation. The present technology also provides echo removal, volume balancing, compression, and time stamping of an audio stream by the client device. Reactions from at least one of buttons and gestures to activate synthesized sounds, for example clapping, booing, and cheering, which are mixed into the mixed audio reaction.

19 Claims, 17 Drawing Sheets

Related U.S. Application Data

(60) Provisional application No. 62/479,475, filed on Mar. 31, 2017, provisional application No. 62/382,699, filed on Sep. 1, 2016.

(51) Int. Cl.

| | | |
|---|---|---|
| *G06F 3/0482* | (2013.01) | |
| *H04N 21/4223* | (2011.01) | |
| *G10L 21/0272* | (2013.01) | |
| *G06F 3/16* | (2006.01) | |
| *H03M 7/30* | (2006.01) | |
| *H04N 7/15* | (2006.01) | |
| *G10L 21/02* | (2013.01) | |
| *G10L 19/00* | (2013.01) | |
| *G10L 21/00* | (2013.01) | |
| *G10L 19/16* | (2013.01) | |
| *G10L 21/0208* | (2013.01) | |
| *H04L 51/52* | (2022.01) | |
| *G06Q 30/06* | (2012.01) | |
| *H04N 21/478* | (2011.01) | |

(52) U.S. Cl.
CPC .............. *G06F 3/165* (2013.01); *G10L 19/00* (2013.01); *G10L 19/167* (2013.01); *G10L 21/00* (2013.01); *G10L 21/02* (2013.01); *G10L 21/0208* (2013.01); *G10L 21/0272* (2013.01); *H03M 7/30* (2013.01); *H03M 7/3059* (2013.01); *H04L 51/52* (2022.05); *H04N 7/157* (2013.01); *H04N 21/4223* (2013.01); *G06Q 30/0603* (2013.01); *G10L 2021/02082* (2013.01); *H04N 21/47815* (2013.01)

(56) References Cited

U.S. PATENT DOCUMENTS

| | | |
|---|---|---|
| 9,501,758 B2 | 11/2016 | Roberts et al. |
| 2007/0028270 A1 | 2/2007 | Ostojic et al. |
| 2008/0209066 A1 | 8/2008 | Spio et al. |
| 2009/0043674 A1 | 2/2009 | Minsky et al. |
| 2009/0138332 A1* | 5/2009 | Kanevsky ............ G11B 27/34 705/7.29 |
| 2009/0171670 A1* | 7/2009 | Bailey ................... G10L 21/06 704/E21.001 |
| 2009/0300525 A1 | 12/2009 | Jolliff et al. |
| 2010/0246788 A1* | 9/2010 | Menard ................. H04M 3/56 379/159 |
| 2011/0043600 A1* | 2/2011 | Gopal ................. H04L 65/403 348/14.09 |
| 2011/0106536 A1 | 5/2011 | Klappert |
| 2011/0225515 A1* | 9/2011 | Goldman .............. G06Q 50/01 715/753 |
| 2012/0155671 A1* | 6/2012 | Suzuki ................... H04M 9/08 381/77 |
| 2013/0019193 A1 | 1/2013 | Rhee et al. |
| 2013/0110565 A1* | 5/2013 | Means, Jr. .......... G06Q 10/063 705/7.11 |
| 2013/0151987 A1 | 6/2013 | Flynn, III et al. |
| 2013/0227467 A1 | 8/2013 | Willis et al. |
| 2014/0173501 A1 | 6/2014 | Wu |
| 2014/0244579 A1* | 8/2014 | Bhogal ................ G06F 16/954 707/623 |
| 2014/0278786 A1 | 9/2014 | Liu-Qiu-Yan |
| 2014/0317510 A1 | 10/2014 | Ku et al. |
| 2015/0106236 A1 | 4/2015 | Morris et al. |
| 2015/0120718 A1 | 4/2015 | Luo et al. |
| 2015/0242061 A1 | 8/2015 | Patel et al. |
| 2015/0262499 A1 | 9/2015 | Wicka et al. |
| 2016/0094475 A1* | 3/2016 | Lynch .................. H04L 67/146 348/14.12 |
| 2016/0188153 A1 | 6/2016 | Lerner et al. |
| 2016/0188181 A1 | 6/2016 | Smith |
| 2016/0344567 A1* | 11/2016 | Navale ............... H04L 65/4038 |
| 2016/0370975 A1 | 12/2016 | Collins et al. |
| 2016/0371751 A1 | 12/2016 | Cohen |
| 2017/0161685 A1 | 6/2017 | Jennings |
| 2017/0188168 A1* | 6/2017 | Lyren .................... G10L 19/167 |
| 2017/0310926 A1 | 10/2017 | Patel et al. |
| 2018/0048768 A1* | 2/2018 | Spittle .................. H04M 3/568 |
| 2018/0063576 A1 | 3/2018 | Tillman et al. |
| 2018/0232121 A1 | 8/2018 | Lewis et al. |

* cited by examiner

Contest States Indicators/Buttons

1. I haven't voted yet — Accepting votes, tap to vote
2. I voted on another entry — Accepting votes, tap to switch votes
3. I voted on this entry — Accepting votes, tap to unvote
4. Winner — Voting complete (not my vote)
5. Winner Voted — Voting complete (my vote)
6. Non-winner — Voting complete
7. Non-winner Voted — Voting complete

MASS MEDIA PRESENTATIONS WITH SYNCHRONIZED AUDIO REACTIONS

CROSS-REFERENCE TO RELATED APPLICATIONS

This application claims priority to U.S. patent application Ser. No. 15/691,639, filed on Aug. 30, 2017, entitled "Social Networking Application For Real-Time Selection And Sorting Of Photo And Video Content," which claims the benefit of U.S. Provisional Application Ser. No. 62/382,699, filed on Sep. 1, 2016, entitled "Social Networking Application For Real-Time Selection And Sorting Of Photo And Video Content," and which also claims the benefit of U.S. Provisional Application Ser. No. 62/479,475, filed on Mar. 31, 2017, entitled "Social Networking Application For Real-Time Selection And Sorting Of Photo And Video Content," which are all hereby incorporated by reference herein in their entirety, including all references cited therein.

FIELD OF THE INVENTION

The present technology is directed to a social networking application, and more specifically, but not by limitation, to systems and methods for implementing a virtual wall of media.

BACKGROUND

The approaches described in this section could be pursued but are not necessarily approaches that have previously been conceived or pursued. Therefore, unless otherwise indicated, it should not be assumed that any of the approaches described in this section qualify as prior art merely by virtue of their inclusion in this section.

A common problem with computer applications is that there is not enough room to display all the media or information that user is interested in. For instance, the user may have a list of one hundred emails or one hundred TV shows they wish to browse through. The standard solution is to summarize these media entries into a list or grid of titles or summaries, or small images, or even small animated images with titles or summaries. However, previous solutions ignore an important aspect of human behavior. Depending on the image, it may not be faster to process small images than large images. In addition, if the summary text is inadequate to actually summarize the material, it may not be easier or faster to process short summaries versus longer or larger, but more easily understood previews.

For example, if a user is shopping for a dress, a small picture of a dress may not provide sufficient information about that dress to determine if the user is interested in that dress. A larger image or even a video may more efficiently or effectively communicate. While larger or longer media may solve one problem, it creates another with respect to where to put the larger summaries, whether text, photo, video, or other media. Typical solutions have been some variant of the hyperlink. If a user is interested in something, the user clicks, taps or otherwise selects a smaller version of that object, at which point the display changes to a larger version of that object. Such a solution is not intuitive. Objects in physical space do not suddenly zoom or teleport in and out of view. Accordingly, there is a need for the development of systems and methods to effectively provide large amounts of information to a user with a natural and intuitive user interface.

SUMMARY

Embodiments of the present disclosure relate to systems and methods synchronizing audio reactions with mass media presentations A computer-implemented method is provided that includes receiving a plurality of audio reactions from a plurality of client devices. The audio reactions are captured by microphones on the client devices and are time-stamped. The method also includes mixing the audio reactions by a mixer server to form a mixed audio reaction, and sending the mixed audio reaction to at least one of the client devices. The client device is adapted to play the mixed audio reaction and a mass media presentation. The mixed audio reaction and the mass media presentation are synchronized to create an audience effect for the mass media presentation.

Exemplary embodiments of the present technology further include performing echo removal, volume balancing, compression, and time stamping of an audio stream by the client device. The exemplary method may include receiving reactions from at least one of buttons and gestures to activate synthesized sounds. The synthesized sounds may include clapping, booing, and cheering. The exemplary method may further include mixing the synthesized sounds into the mixed audio reaction by at least one of mixer server and the client device. When the synthesized sounds are mixed into the mixed audio reaction by the mixer server, the mixer server may create a crowd mix by combining the audio reactions and the synthesized sounds and transmit the crowd mix to the client devices that have selected to play the audience effect. When the synthesized sounds are mixed into the mixed audio reaction by the client device, a count of the synthesized sounds and the mixed audio reaction may be transmitted to the client devices that have selected to play the audience effect.

An exemplary computer-implemented method is provided that includes associating a subset of client devices to form a friend group. The subset of client devices are selected for association based on a first proximity between users of the client devices in a virtual stadium and/or a second proximity between users of the client devices in a social graph indicating strength of relationship. The exemplary method further includes receiving by the client devices of the friend group audio reactions from other client devices of the friend group, and enabling adjustment of a first volume of the other client devices of the friend group, a second volume of the mixed audio reaction, and a third volume of the mass media presentation. The exemplary method also includes controlling a number of the subset of client devices forming the friend group to below a maximum number to enable users of the subset of client devices to talk to each other over the audience effect.

Exemplary computer-implemented methods include dividing, by the mixer server, the virtual stadium of client devices into two or more mixes. The exemplary method also includes mixing separately an audio reaction of the client device and other client devices of the virtual room of the client device. The exemplary method further includes combining the audio reaction of the other client devices of the virtual room of the client device and audio reaction mixes of other virtual rooms to produce an audience reaction mix of the virtual stadium excluding the audio reaction from the client device.

Further exemplary computer-implemented methods include generating a graphical user interface by a client device. The graphical user interface has one or more indicators and one or more controls for a volume of at least one of the virtual stadium, a virtual room, and a synthesized sound. The exemplary method also includes providing a selector for automatically balancing the audio mix comprising lowering the virtual stadium sounds to ensure that priority participants are audible. The exemplary method further includes assigning by the mixer server to a user a preferred virtual room based on which virtual room most friends or acquaintances of the user are occupying. The exemplary method includes receiving by the user an invitation from another user to another virtual room. The exemplary method also includes recording the mass media presentation and the audience effect. The recording of the audience effect is selectable by a subsequent consumer of the mass media presentation.

Further exemplary embodiments include grouping the client devices into a plurality of virtual rooms, and assigning a location in the virtual room for a user of the client device. The assigning is performed by the user and/or the mixer server, and the location determines a speaking sound level for the user speaking and a listening sound level for the user listening. The exemplary method also includes combining by the mixer server audio inputs from terminals of virtual participants in the same virtual room into a single virtual room audio stream. The mixer server adjustsa volume of the virtual room audio stream and transmits the virtual room audio stream to the client devices associated with the virtual room. The mixer server adjusts the volume, stereo mix, head related transforms, and room parameters to create an effect of a real space. The user and other users of the client devices grouped into a same virtual room hear each other at a normal volume. Further users in other virtual rooms are played at a reduced volume.

In a still further exemplary embodiment, the computer-implemented method includes displaying a name and/or an avatar of a speaker when an audio stream from the speaker is at sufficient volume to be understandable. The exemplary method further includes enabling activation of the at least one of the name and the avatar by a user to: obtain additional information and interfaces relating to the speaker, review or replay the audio stream from the speaker, have a private conversation with the speaker, change a volume of the audio stream from the speaker, mute a volume of the audio stream from the speaker, and block the audio stream from the speaker.

In yet another exemplary embodiment, the computer-implemented method includes subtracting a particular one of the audio reactions from the mixed audio reaction when the mixed audio reaction is played on a particular one of the client devices. The particular one of the audio reactions is received from the particular one of the client devices.

In another exemplary embodiment, the computer-implemented method includes providing a plurality of audio reactions of a first set of the client devices associated with a virtual room. The first set of client devices transmits audio reactions, and the plurality of audio reactions are mixed at a particular one of the first set of the client devices without the audio reaction from the particular one of the client devices. The exemplary method also includes providing a same virtual room mix of the first set of the client devices to a second set of the client devices associated with the virtual room. The second set of the client devices does not transmit audio reactions.

In further exemplary embodiments, the computer-implemented method includes associating the client devices with a plurality of virtual rooms, and splitting the virtual rooms into two or more virtual sub-rooms. The exemplary method also includes sending by the mixer server an audio reaction sub-room mix of a first sub-room of the virtual room that does not include an audio reaction of a user, and sending by the mixer server a plurality of audio reactions of client devices of a second sub-room of the virtual room that does include an audio reaction of the user. The exemplary method further includes mixing by the client device the audio reaction sub-room mix of the first sub-room and the plurality of audio reactions of the client devices of the second sub-room excluding the audio reaction of the user.

In some embodiments, the method includes positioning users in a virtual space so that nearby virtual rooms or participants can be spatialized using spatialization techniques, and treating users associated with other rooms as simple ambient mixes. The exemplary method further includes selecting by a user a position within a virtual room. The position is a virtual empty seat and/or a virtual proximate position with respect to another user. The selection is transmitted to the mixer server. The exemplary method also includes mixing separately by the mixer server an audio stream associated with the user based on the selection.

In a still further exemplary embodiment, the computer-implemented method includes providing a graphical user interface for a user to select to hear certain users and to mute other certain users. The exemplary method also includes selecting by an event producer to mute at least one of further certain users, groups of virtual rooms, and particular virtual rooms.

In some embodiments, the method includes assigning by the mixer server a user to a virtual room containing a highest number of friends of the user, and collecting by the mixer server a highest rated content from a plurality of virtual rooms. The exemplary method further includes promoting the highest rated content to other virtual rooms.

In a still further exemplary embodiment, the method includes determining a time window for cutoff of audio reactions by analyzing a distribution of at least one of pitch and volume of the audio reactions. The mixing of the audio reactions by the mixer server to form the mixed audio reaction may not include audio reactions received after the time window.

In yet another exemplary embodiment, the computer-implemented method includes increasing a volume of one of the audio reactions in the mixed audio reaction by the mixer server based on a ticket cost, a fame of the user, a payment, a point allocation, and/or a virtual gift. The exemplary method also includes enabling a live performer to hear one of the audio reactions based on the user presence in a virtual VIP room, and continuing to form the mixed audio reaction when the mass media presentation one of stops or pauses.

In some embodiments, the mixed audio reaction includes a plurality of layers, and a corresponding volume level for each of the layers is separately controlled relative to the other layers. In the exemplary method, the sending of the mixed audio reaction to the client devices includes sending a virtual room layer corresponding to a virtual room of the client device. An announcer layer may correspond to an audio of an announcer. A crowd audio may correspond to a mix of the virtual rooms excluding the virtual room of the client device, and a mass media audio may correspond the mass media presentation.

In yet another exemplary embodiment, the computer-implemented method includes detecting for feedback and offensive noises in the plurality of audio reactions, and converting speech to text in the plurality of audio reactions to check for offensive language. The exemplary method may also include adjusting a volume of ones of the audio reactions having at least one of feedback, offensive noises, and offensive language. The adjusting may include reducing and muting.

An exemplary system is provided that includes a receiving module adapted to receive a plurality of audio reactions from a plurality of client devices. The audio reactions are captured by microphones on the client devices and are time-stamped. The client devices perform echo removal, volume balancing, compression, and time stamping of the audio stream by the client device. The client devices receive reactions from buttons and/or gestures to activate synthesized sounds. The synthesized sounds including clapping, booing, and cheering. The exemplary system also includes a mixer server adapted to mix the audio reactions to form a mixed audio reaction. The mixer server further mixes the synthesized sounds into the mixed audio reaction to create a crowd mix by combining the audio reactions and the synthesized sounds. The mixer server associates a subset of client devices to form a friend group. The subset of client devices are selected for association based a first proximity between users of the client devices in a virtual stadium space and/or a second proximity between users of the client devices in a social graph indicating strength of relationship. The exemplary system further includes a transmitter adapted to send the mixed audio reaction to at least one of the client devices. The client device is adapted to play the mixed audio reaction and a mass media presentation. The mixed audio reaction and the mass media presentation are synchronized to create an audience effect for the mass media presentation. The transmitter sends audio reactions to the client devices of the friend group from other client devices of the friend group to enable adjustment of a first volume of the other client devices of the friend group, a second volume of the mixed audio reaction, and a third volume of the mass media presentation. The mixer server controls a number of the subset of client devices forming the friend group to below a maximum number to enable users of the subset of client devices to talk to each other over the audience effect.

In some embodiments, the mixer server groups the client devices into a plurality of virtual rooms and assigns a location in the virtual room for a user of the client device. The assigning is performed by the user and/or the mixer server, and the location determines a speaking sound level for the user speaking and a listening sound level for the user listening. The mixer server combines audio inputs from terminals of virtual participants in the same virtual room into a single virtual room audio stream. The mixer server adjusts a volume of the virtual room audio stream and transmits the virtual room audio stream to the client devices associated with the virtual room. The volume, stereo mix, head related transforms, and room parameters are adjusted to create an effect of a virtual room. The user and other users of the client devices grouped into a same virtual room hear each other at a normal volume, and further users in other virtual rooms are played at a reduced volume.

In still further exemplary embodiments, the system includes a display adapted to display a name and/or an avatar of a speaker when an audio stream from the speaker is at sufficient volume to be understandable. The display enables activation of the the name and/or the avatar by a user to: obtain additional information and interfaces relating to the speaker, review or replay the audio stream from the speaker, have a private conversation with the speaker, change a volume of the audio stream from the speaker, mute a volume of the audio stream from the speaker, and/or block the audio stream from the speaker.

BRIEF DESCRIPTION OF THE DRAWINGS

The accompanying drawings, where like reference numerals refer to identical or functionally similar elements throughout the separate views, together with the detailed description below, are incorporated in and form part of the specification, and serve to further illustrate embodiments of concepts that include the claimed disclosure, and explain various principles and advantages of those embodiments.

The methods and systems disclosed herein have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

DETAILED DESCRIPTION

Figure 1:
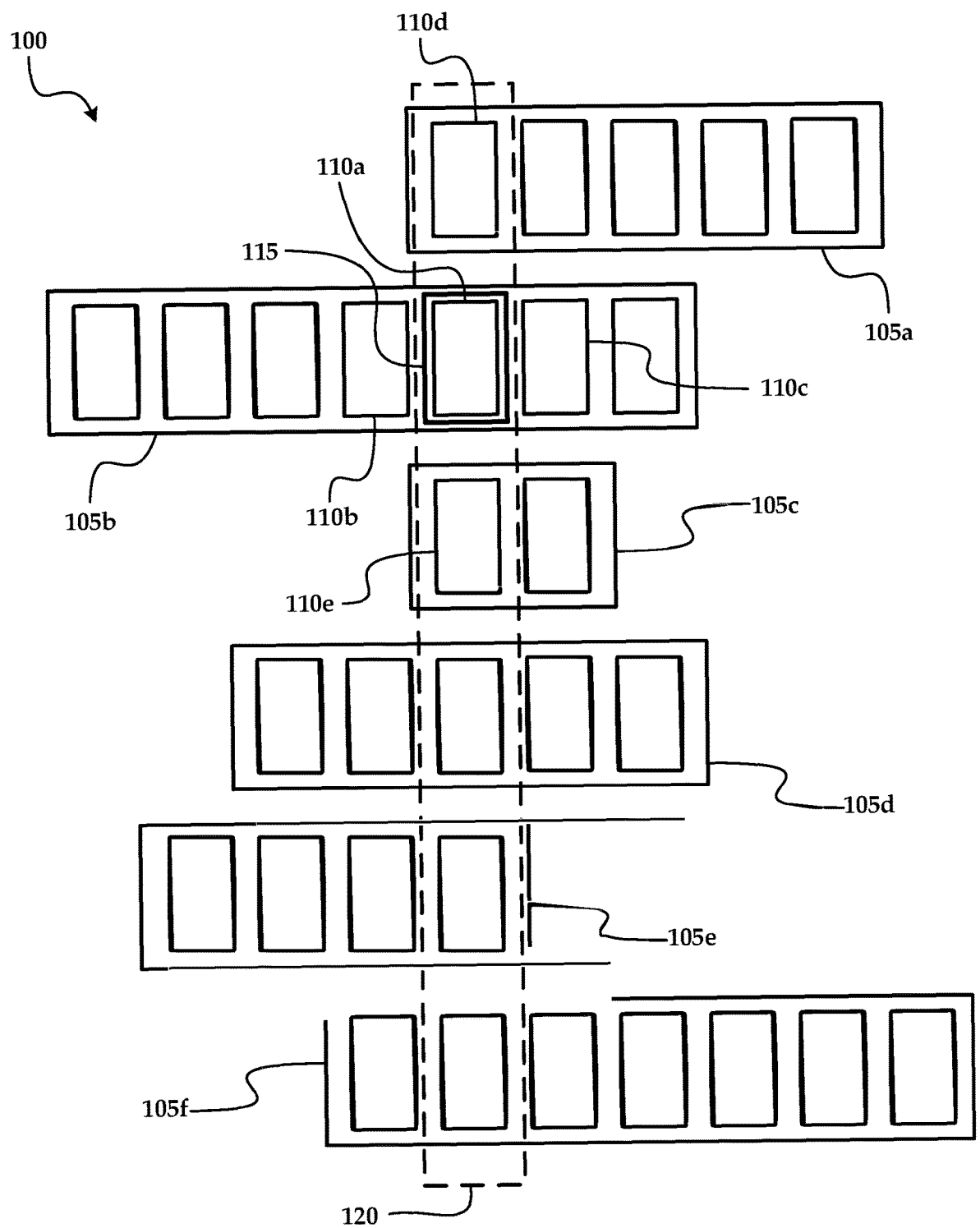
FIG. 1 illustrates a diagrammatic representation of a virtual wall, according to the present disclosure.

The following detailed description includes references to the accompanying drawings, which form a part of the detailed description. The drawings show illustrations in accordance with exemplary embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed.

The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Various embodiments described herein relate to systems and methods for providing real-time selection and sorting of media content.

In some embodiments, systems and methods of the present disclosure include a virtual wall having a plurality of media, as referred to as entries or media items. The system, a client device for example, lays out the entries, typically at full size, horizontally and vertically in the virtual wall. The user may navigate through the entries as rapidly as they wish as tiles or pages in the virtual wall. This is an improvement on an older, one-dimensional solution called a carousel. In the carousel, a page mechanism allows users to see pages, which may contain images or even videos laid out from left to right in a consistent order, by 'going' left or right. A similar, existing one-dimensional solution is to read entries by navigating up and down, otherwise known as a vertical strip.

The virtual wall may display the largest possible images, videos or pages, and in a preferred embodiment, displays them at full screen. No additional zoom/un-zoom step is necessary to display media at its full size, nor is any scrolling required, as the tiles or entries in the virtual wall are already properly scaled, to fit perfectly within the virtual wall. Unlike the more primitive one dimensional solutions, or complex mixed systems of scrolling, zooming and navigation, the virtual wall facilitates near instant access in two dimensions, effectively laying out pages or media in a two dimensional virtual wall that does not require complex zoom or scroll commands. The User taps or flicks or otherwise indicates their desire to navigate to the next item above, below, right or left. Instead of hiding objects 'too big' or 'too many' to fit onto the screen into a hyperspace joined with hyperlinks, the virtual wall makes it extremely easy and fast to navigate from video scene to scene, image to image, or page to page, and from video to video, album to album, or chapter to chapter.

FIG. 1 illustrates a diagrammatic representation of a virtual wall 100. The virtual wall 100 is a two dimensional, arrangement of media (videos, photos, text or combinations of the above, etc.) in full-sized (often full screen) tiles or pages (also referred to as media items).

In certain applications, pages or tiles are often arranged into strips, otherwise known as media sequences or carousels (such as carousels 105 a-f), from left to right, on which simple interfaces or gestures are used to move through the pages from horizontally, from left to right or right to left. Each carousel 105 a-f may represent an event, show, chapter, article, episode, story, etc.

In the virtual wall 100, many carousels 105 a-f, or horizontal strips of pages, are stacked vertically, and simple gestures are used to move vertically, from one horizontal strip to the next above or below. Up/down buttons or gestures move up and down between carousels, unlike traditional interfaces, where up/down gestures or interfaces scroll a page up and down. In the present embodiment, to navigate the display 115 to the next carousel, for example from a second carousel 105 b to a third carousel 105 c, a swipe down gesture or go down button can be pressed by the user and determined by a processor of a client device. In the present example, media item 110 a is currently displayed as represented by display 115. The client device receives a user input to navigate between carousels, and in response to the user input transitions between the currently displayed media item 110 a to a media item in a different carousel, such as media items 110 d-e. To navigate to the next media item within a carousel (such as to the next page, clip or sequence within a multiple page/part chapter, article, episode, story, etc.), a swipe right gesture or go right button can be pressed by the user and determined by the client device. For example, the client device receives a user input to navigate between media items within a carousel, and in response to the user input transitions between the currently displayed media item 110 a and a next or previous media item within the carousel, such as media items 110 b-c.

Unlike the standard hyperlink arrangement in which media is not mapped to a two-dimensional space, in the virtual wall 100 each media element is located in a specific row and column. The arrangement in the virtual wall 100 is much easier to navigate and recall than the traditional hyperlink system, where objects do not have a clear location in a two dimensional space. However, unlike a simple 2D grid of tiles, each row works as a carousel, so while up-down navigation increments or decrements the vertical coordinate of which tile or page being view is displayed, the horizontal coordinate depends on the position of that row's carousel. As shown in FIG. 1, the vertical axis is represented as column 120, within which the display 115 is moved up and down from one carousel to the next, otherwise described as moving from one vertical coordinate to the next. Diagrammatically, each carousel 105 a-f shifts either left or right to display each media item of the currently viewed carousel, or to shift the horizontal coordinates of the currently viewed carousel. It is to be understood that each carousel may have a varying number of media items.

In order to simplify navigating the virtual wall 100, in one or more embodiment, navigation may be limited to either vertical or horizontal movement, but not both at once. Thus, for example, if the user swipes/mouses/gestures mostly left but also up, the up component is ignored. The client device may determine a directional vector of the user gesture, determine the largest component of the directional vector in a horizontal or vertical direction, and further select the direction of the largest component to navigate the display 115 to another media item either in the same or different carousel. It is to be understood that, while one or more embodiments throughout the present disclosure refer to directions such as left, right, up and down, the virtual wall 100 may be flipped or rotated in any suitable orientation. For example, media items within a carousel may be oriented between a first and a second opposite direction, such as left and right respectively, along a first directional axis, while media items between different carousels (such as along column 120) may be oriented in a third and fourth opposite direction, such as up and down respectively, along a second directional axis.

The virtual wall 100 includes several other important advantages over the standard hyperlink solution. Since, unlike Hyperlinks, there are a limited number of possible objects to directly navigate to (in most embodiments there are four objects—up/down/left/right, but more are possible with additional navigation elements), the client device can more easily provide a 'look ahead' media caches, particularly to the next page or tile, to reduce any latency or lag view images/views. In other words, the client device stores in memory the media items corresponding to the next and previous media items in a current carousel, and the media items to be displayed for a next and previous carousel. Such media items are referred to as being adjacent media items to the currently displayed media item.

The virtual wall is not just a two dimensional grid of large tiles, with two important differences. The first difference is that in a grid, all rows are the same length. In the virtual wall 100, rows are as long as necessary to contain the elements on each row. The second difference is how row-to-row navigation works. In a grid, navigation up or down does not change the column, only the row. In the virtual wall 100, navigation up or down, in some embodiments, also changes the column. In some embodiments, moving down a row also moves the column back to the leftmost position. Other, more sophisticated embodiments are described below.

The virtual wall 100 facilitates remembering 'where' an object is in the virtual wall 100. With hyperlink objects in hyperspace—which has no particular correspondence to real space, it is very difficult or impossible for a user to utilize the user's natural ability to remember where things are placed—ahead, behind, left, right, after, before, above, below, near, etc. On the contrary, by using the virtual wall technique, entries have a place. So as the user transverses through the virtual wall 100, it is simple for both the user and the client device to remember and store in memory, for each row, which column the user last viewed, and when the user returns to that row, display that column. In other words, the client device stores in memory a column position of the last displayed media item for a carousel, for each carousel, which helps act as a reinforcing mnemonic element for the user. Furthermore, since media objects are laid out in a 2D space, the virtual wall 100 facilitates creating smaller one or two-dimensional 'summaries' of parts of the larger 'virtual wall', as will be described in greater detail below.

The virtual wall 100 may implement various methods of organizing media content or other items. In some embodiments, the virtual wall 100 displays items in order of relevance, importance or quality. Items with higher scores, or move votes, etc., will be sorted from left or right, or up or down, or nearer or further from the current position in the virtual wall 100. In some embodiments, the virtual wall 100 provides media content by time or inherent order. Media items that follow sequentially will be ordered in that sequence. That is, a first item in a row may correspond to the beginning of a row, a story, a video, a set of choices, etc. The next item, for example to the right, corresponds to the next choice, in space or in time. Moving further in the same direction, for example to the right, moves through the list, from start to end. Moves left, or in the opposite direction, will move up or back through the list. In some embodiments, the start and end or end and start are connected like a circular carousel.

In some embodiments, a first displayed media item of a row or carousel, otherwise referred to as a starting element, is not necessarily the leftmost media item of the list. In one embodiment, the first displayed element in a row is the one the user most recently viewed, unless that element was viewed to completion, in which case the next element in that row is displayed. The next element after the final, rightmost element, may be the first, or leftmost element, effectively 'wrapping around' that row. The client device may determine the first displayed media item based on the user and the situation. For example, the starting element, or all elements, can be randomly or algorithmically selected from the list of items. Randomizing the elements facilitates that elements receive approximately the same attention. In a further embodiment, the client device may determine the first displayed item is the item having the greatest ranking or rating of the items. For example, the client device may highlight a particular element, for instance the top choice out of twenty choices, by selecting the top choice as the starting position. In some embodiments, to draw attention to a new element, or 'page' with new information, the client device places the new item in the leftmost position, or the client device sets the carousel position so that the new item is the first item to be displayed.

In certain embodiments, the client device may deemphasize one or more media items of a row or carousel. For example, certain media items may have already been seen by the user, have low scoring, have been identified as not useful or hidden, or otherwise indicated to be deemphasized. In some embodiments, the system may determine not to display any deemphasized items, or to skip over them, or displaying for a short amount of time, or flowing over them more quickly than normal.

While navigation from carousel to carousel may go from a start position in a first carousel to a start position in a second carousel, this may not be ideal in all situations. In certain embodiments, the client device stores in memory the last position of each carousel. However, in one or more embodiments, if the media in the last position has completely played, the first carousel associated with that media is advanced to the next position. If the user navigates off the first carousel, as the client device has completely played the media, the last position of the first carousel is modified to the next element.

In some embodiments, the system determines a predetermined ordering of entries within a carousel (typically left-right) and from carousel to carousel (typically up-down). The inter-carousel arrangement may be based on time or sequence (that is, the most recent item is at the top) and older items are below, though the reverse is also possible. The client device may either manually or automatically advance, from left to right, top to bottom or in some other simple progression, as otherwise described in the present disclosure.

Figure 2:
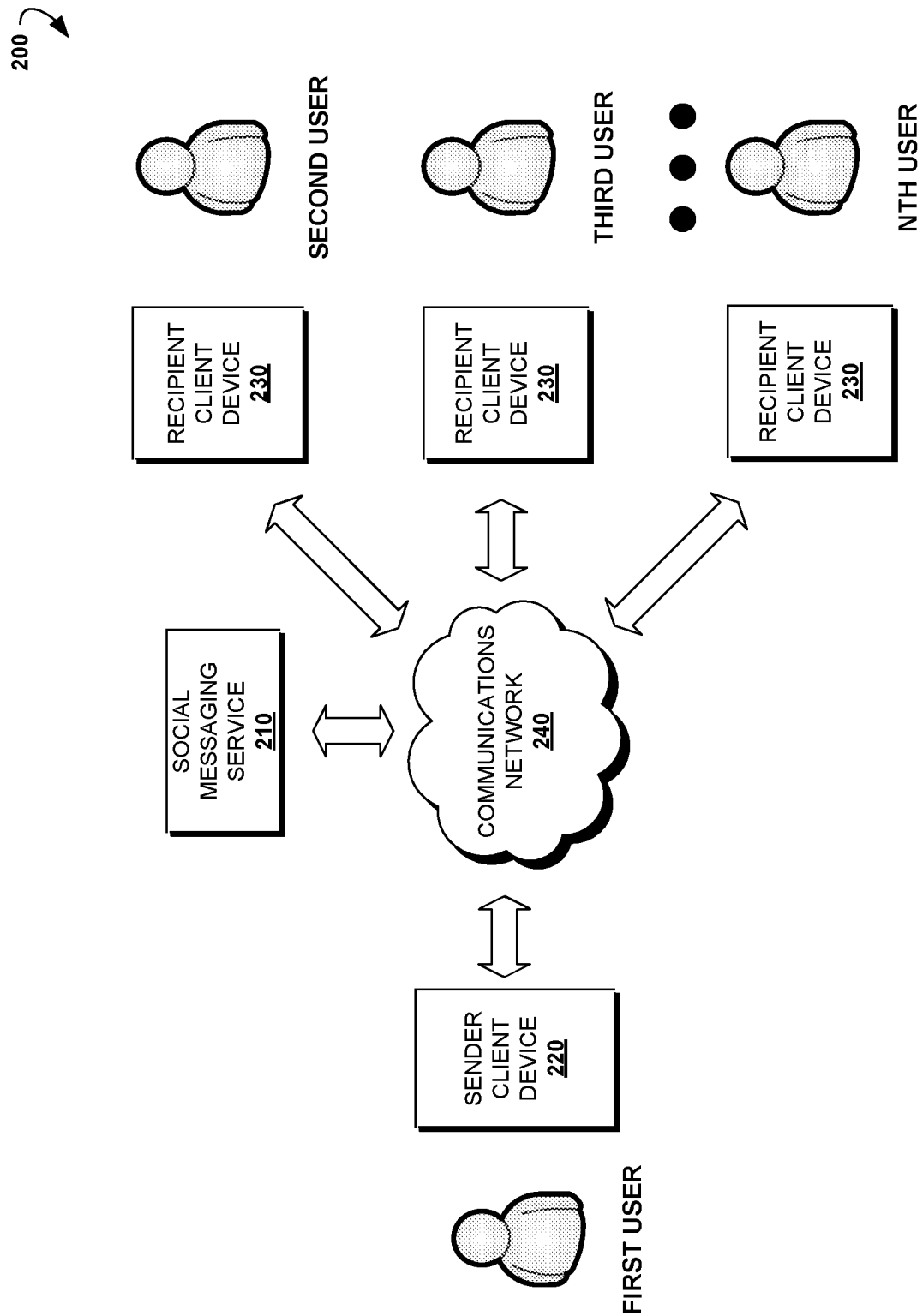
FIG. 2 shows a high-level block diagram of an exemplary social messaging network 200, according to the present disclosure.

FIG. 2 illustrates a high-level block diagram of an exemplary social messaging network 200 having a social messaging service or system 210, at least one sender client device 220 (e.g. first user), at least one recipient client device 230 (e.g. second user, third user, to Nth user) and a communications network 240. In general, the client devices 220, 230 may relate to a wide range of electronic devices including, but not limited to, a smartphone, computer, desktop computer, laptop computer, tablet computer, PDA, wireless telephone, cellular phone, television system, remote controller, gaming console, gaming pad, in-vehicle computer, infotainment system, smart home computer, smart watch, wearable computing device, and any other suitable electronic device having at least one processing or computational unit. In various embodiments, the client device may be equipped with a digital video camera configured to capture digital media such as photo and/or video and to transmit the digital media to a remote location. In addition, the client device may have various input/output devices for interactions with a user, including but not limited to a touch screen display, keyboard, key pad, trackball, touchpad, display, monitor, television, projection system, augmented or virtual reality system, or other suitable input/output device. The client devices 220, 230 may be implemented by exemplary computer systems such as those shown and described in FIG. 17. The exemplary social messaging network 200 is further described in related U.S. patent application "Social Messaging System For Real-Time Selection And Sorting Of Photo And Video Content" (application Ser. No. 14/998, 106) filed Dec. 23, 2015, which is hereby incorporated by reference for all purposes. It is to be understood that the client devices 220, 230 may implement one or more of the methods of the present disclosure, including generating and storing the virtual wall 100. While many embodiments describe the client device performing certain steps, it is to be understood that one of ordinary skill in the art would understand some or all of the recited steps may be performed on the social messaging service or system 210.

FIGS. 3-6 depict an exemplary graphical user interface 300 displaying a media item from the virtual wall 100. The displayed media item, first media item 305 *a*, may be the media item 110 *a* as represented in FIG. 1.

Figure 4:
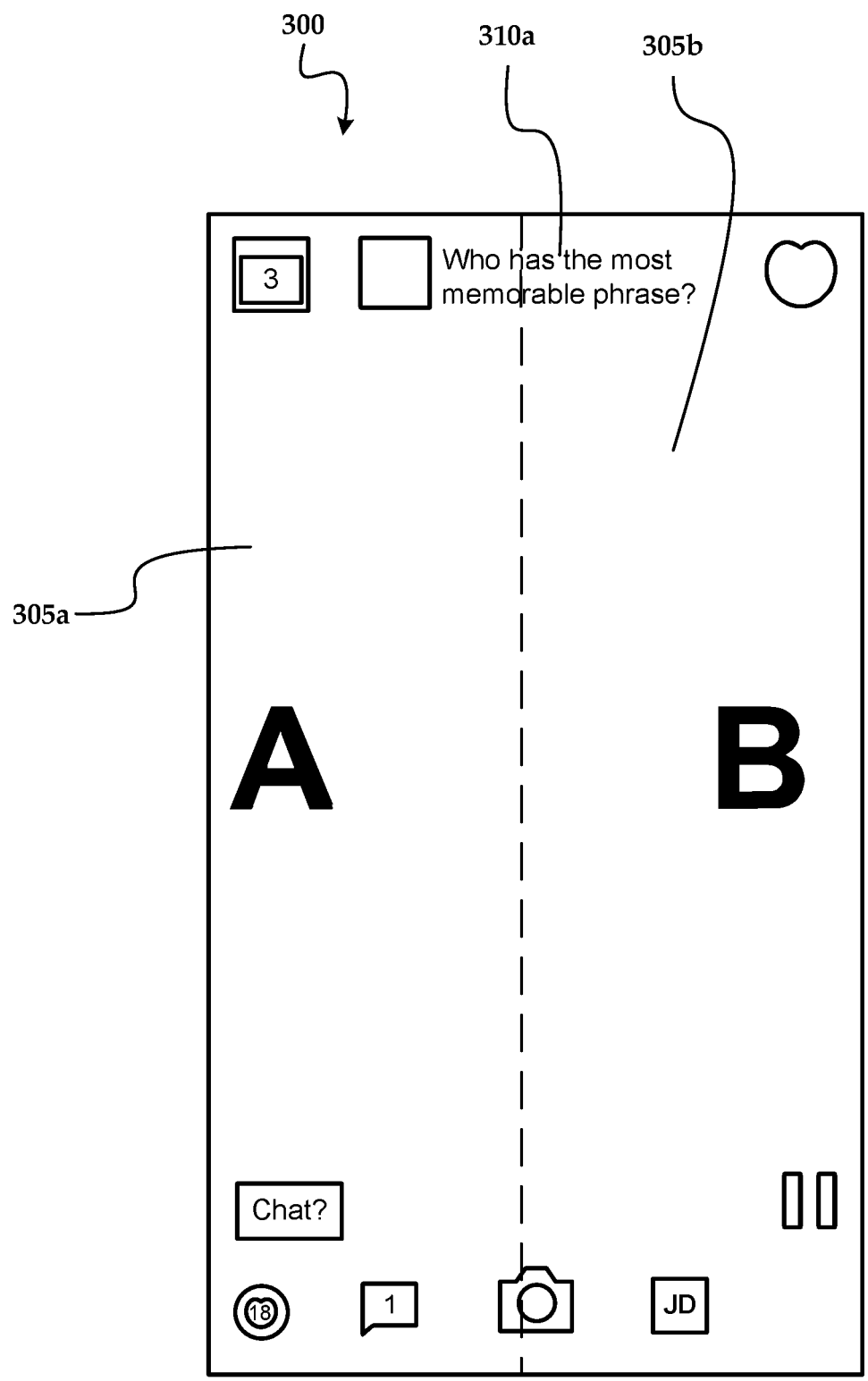

FIG. 4 illustrates an exemplary transition of the graphical user interface 300 from the first media item 305 *a* to a second media item 305 *b* within a carousel. The transition may be the transition from media item 110 *a* to media item 110 *c* within carousel 105 *b* as shown and described in the diagrammatic representation of FIG. 1, for example. The advancement from the first media item 305 *a* to the second media item 305 *b* may be automatic, manual, or a combination of both.

In one or more embodiments, a finger flick gesture from right to left advances the current view to the next entry 305 *b* in the carousel, and a finger flick gesture from left to right changes the current view back to the previous entry 305 *a*. FIG. 4 depicts a frame of a transition between displaying the first media item 305 *a* and the second media item 305 *b* in response to a finger flick gesture from right to left on the graphical user interface 300 of FIG. 3. It is to be understood that a finger flick gesture may be one of many suitable user inputs, such as pressing an arrow button, received and determined by a processor of the client device to trigger the transition between media items and carousels.

Figure 3:
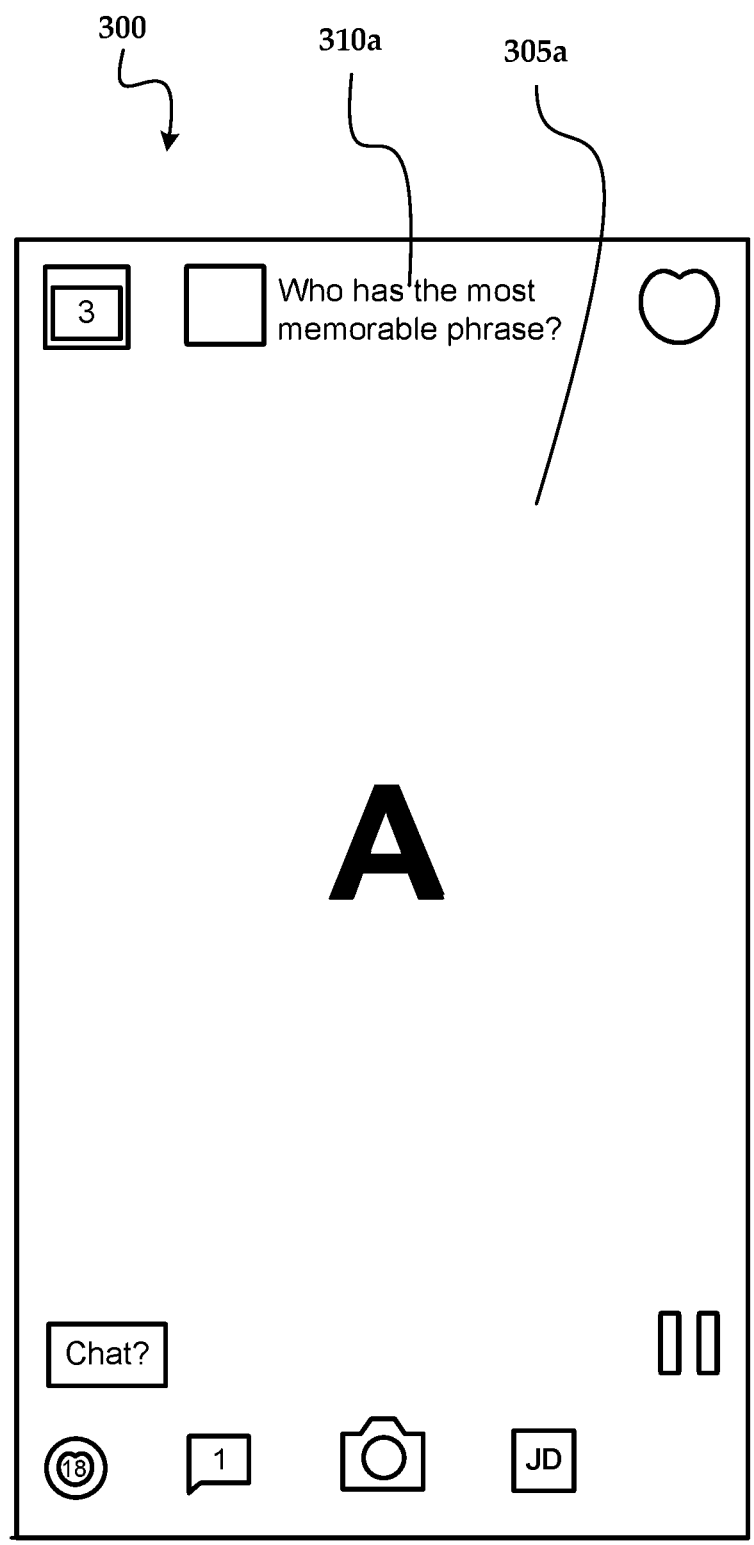
FIGS. 3-6 depict exemplary graphical user interfaces displaying a media item of the virtual wall illustrated in FIG. 1, according to the present disclosure.
Figure 5:
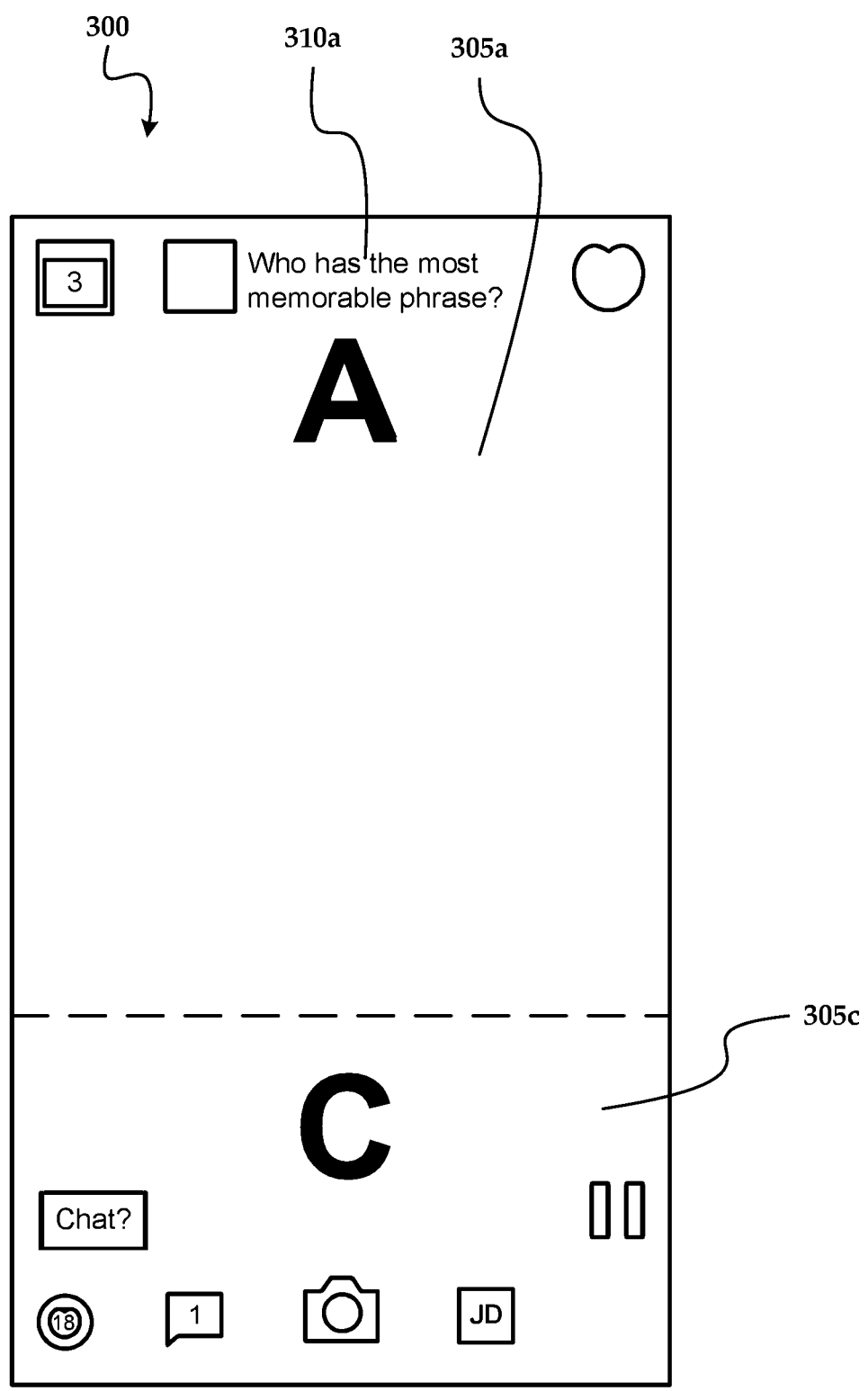
Figure 6:
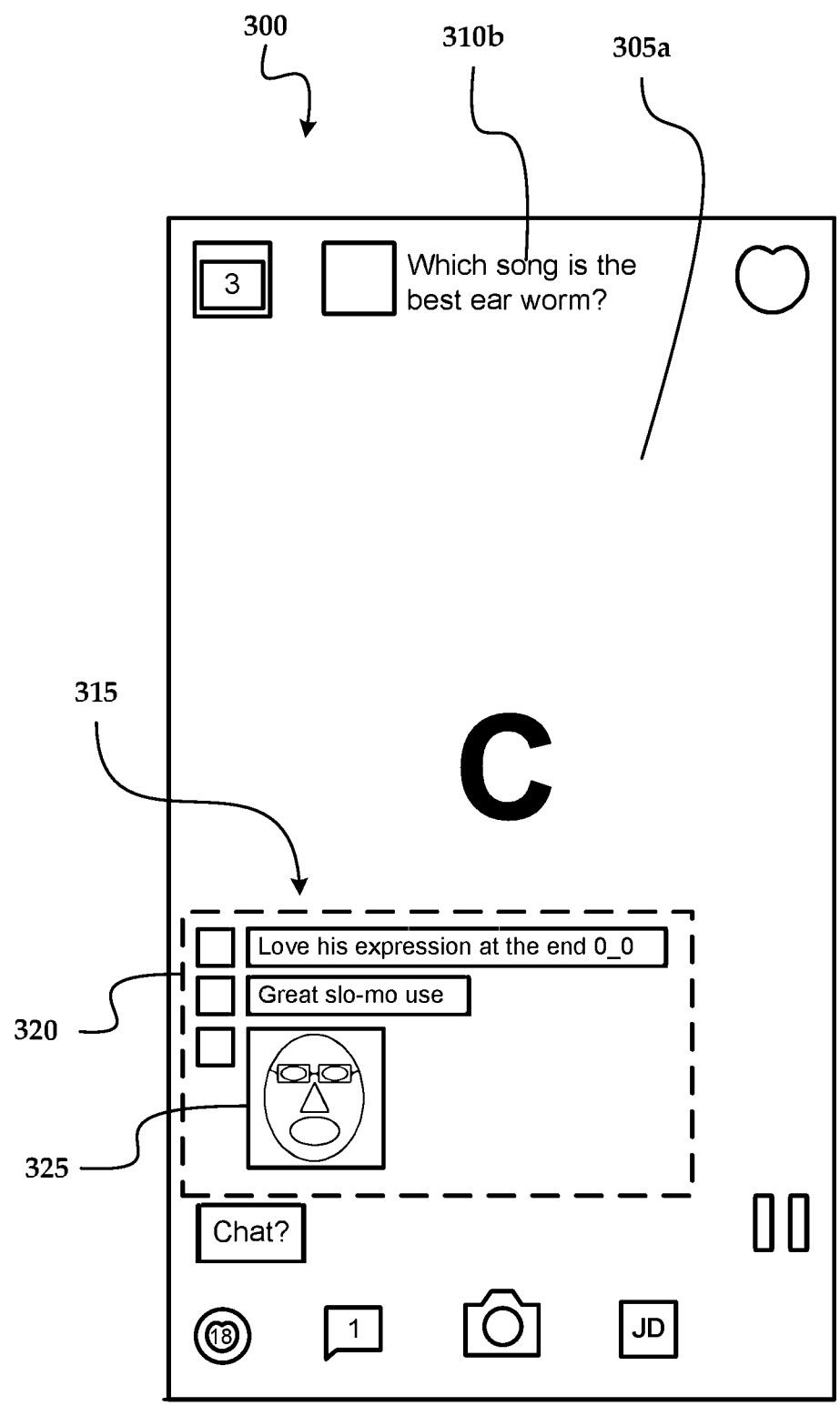

FIG. 5 shows a further example of the graphical user interface 300, in which a finger flick gesture from bottom to top starts a next carousel and a finger flick gesture from top to bottom starts the previous carousel. In particular, in response to receiving the finger flick gesture, or other suitable user input, the client device transitions the display of the first media item 305 *a* of a first carousel (as shown in FIG. 3) to a first media item 305 *c* of a second carousel (as shown in FIG. 6). Other information associated with the media item or carousel may also transition from the first media item 305 *a* to the first media item 305 *c*. For example, a first title 310 *a* or description of the first carousel will update, via the client device and graphical user interface 300, to a second title 310 *b* of the second carousel. Furthermore, chat information in a chat overlay 315 may be associated with a particular media item, and will update upon display of a new media item.

The media items may be arranged both horizontally and vertically so that the user's swipe, flick, or other direct manipulation corresponds directly to a two dimensional location of the media item they wish to navigate to. In some embodiments, in response to the user gesturing to the next media item when the currently displayed media item is a last media item of the current carousel, the current view will appear to shift normally (shift from right to left) but will display a first media item of the subsequent carousel. As such, the graphical user interface 300 may display each media item of the carousel sequentially and will loop to the next carousel upon reaching the last media item.

In various embodiments, the virtual wall 100 is used to display videos. Unlike static images or page layouts, videos have a time component or duration. When videos are completed, in traditional implementations, they stop, pause or loop. All of these options break the continuity of user experience. Alternatively, upon completion of playback of a video, the tile displayed on the virtual wall 100 slides off to the left and a new tile, representing the next video to be displayed, slides in from the left. The next video may be a new video or a next part of a longer video broken into separate discrete pieces. The new video may start to play the moment the previous video finishes playback, so that the user receives a continuous video experience, which is often highly desirable.

In some embodiments, if the last video or media item in a carousel plays to the end, or is manually advanced, instead of pausing, stopping, or wrapping around to the first media item in that carousel, the display may automatically transition to the next item in the next carousel, that is vertically, in a continuous manner. The transition may be similar to transitioning from one video to the next video horizontally within a carousel, or in other embodiments, the completed video or media item may slide left and up as the next video or media item slides in from the right. The inverse action may take place if the user goes backwards. Similarly, if the user wishes to skip ahead, or skip back to the next or previous row in the wall, the user may navigate up or down. In both cases, the transition from one carousel to the next carousel enables a nearly seamless selection and play of related content in an intuitive manner, by arranging them vertically adjacent.

In some embodiments, the client device determines a duration each media item is displayed on the graphical user interface 300 before automatically proceeding to the next media item of a carousel. In the simplest case, the duration may be the length of the video, or a fixed amount for viewing a photo. However additional time may be necessary, to either read or listen to comments added to the media item or to give users time to make a decision to vote, or other interface interactions.

Users may need some time to make a decision about a media item. If the media item is of short duration, and if the media item automatically advances after play, the user may not have time to make a decision before the media item is advanced to the next media item. In some embodiments, the client device loops the media item until there is sufficient time to review and interact with the media item as desired. For example, in the case where at least 10 seconds is needed to view and react, and a video is only 4 seconds long, the client device may loop the video multiple times. Each time the media item completes, the client device may determine if a total time the media item has been displayed is less than the predetermined duration for the user to view and react. If not enough time has passed, the client device loops the video, or stays on the image. Otherwise, if the total time the media item has been displayed is greater than the predetermined duration, the methods advance to the next media item.

FIG. 6 further illustrates that, in addition, a media item in a carousel may include additional layered information; such as a chat overlay 315. The additional layered information enables the user to combine media and messaging seamlessly.

There are several well know methods of reacting to, commenting on, or otherwise providing feedback to media. For recorded media, typically comments are created and appear below or in a different area than the media. With such methods there is no attempt to match the comments to the part or scene of the media the comments might correspond to. For live media, typically comments are created as the media is being watched and are time stamped so that the comments can be synchronized to the media at the associated time stamp. This method, unfortunately, put a burden on the creation creator to exactly time his or her reaction. The typical result is that comments are created late, often after the time in the media that the reaction is appropriate too. Additional comments further complicate the situation as it becomes difficult to create or review multiple comments quickly.

In various embodiments, the client device uses video capture to create audio or video reactions, referred to herein as reactions (for example reaction 325 displayed in the chat overlay 315). Unlike standard audio or video messaging, reactions are designed to provide commentary or discussion about the associated underlying media, or as a reply to a previous message, not as standalone messages.

Unlike standard messaging, reactions are created over the relevant media. Creating a reaction while currently viewing the associated media item is a far simpler process than creating a reaction, and then subsequently finding the right media and right time to attach the reaction to. In some embodiments, in response to determining a user input such as a gesture, command or other UI element indicative of a desire to create a reaction, the reaction UI is displayed over the media which the user wishes to react. In some embodiments, the client device pauses the underlying video in response to generating and displaying the reaction UI.

In some embodiments users may be able to suppress the playback of the reactions though a gesture or interface, such as a distraction-free interface.

If the reaction has audio, and a volume of the client device is off or too low to be heard, or set in a caption mode, in some embodiments, the client device may use speech to text methods to display the text of the audio. To help ensure that audio reactions can be heard, the client device may reduce the volume of the underlying video. If the underlying video ends before the reaction is played to its end, the client device may loop the underlying video. The system may automatically play reactions, starting from a first video reaction (which may be the one at the top) and play in time sequence from there to preserve the order of the conversation. Alternatively, if there are too many reactions to play all of them, the system may skip older or less important reactions.

In response to receiving a user input associated with pausing, in a preferred embodiments, the client device pauses both the main video and the reaction videos, to ensure that the user has a simple and fast way of freezing and silencing their application Also, in some embodiments, if the user taps a small reaction image or video, or otherwise indicates interest in a particular reaction, the client device visually expands the reaction significantly, in one embodiment, as large as will fit on the screen. Furthermore, in response to the user expanding the reaction to full screen, the client device pauses the underlying video, thus reducing its volume to zero. In one embodiment, tapping on a large reaction will return it to normal size. In related embodiments, if a large reaction has been shrunk, it is also paused, and the next reaction, if any, is played.

In one embodiment, if there are multiple reaction videos to play, once one reaction video is enlarged, the user can advance to the next reaction, or go back to the previous reaction, with appropriate gestures or buttons, such as a swipe gesture.

In another embodiment, reactions play one at a time. While the reactions may play in order, from top to bottom, left to right, etc., the user can tap to skip any reaction to skip to that specific reaction.

In certain embodiments, in response to receiving a scrolling interface or gesture, the client device scrolls the chat window 320 that overlays the media item 305 a. If the scrolling the chat window 320 brings additional reactions on screen, the client device may automatically play the additional reactions. The client device stores a record of which reactions have and have not played so that previously played reactions can be skipped.

In other embodiments, navigating through a list of reactions can be done with an interface described below, the vertical navigator.

In various embodiments of the present disclosure, long videos are segmented by the client device into a series of shorter, scenes or clips, generally with some easy way to play and navigate through these clips, such as the virtual wall 100 in FIG. 1. Once longer media has been split up into multiple parts, it is far easier to provide feedback or reactions on each segment or clip. If the user chooses to interact with a particular clip, the client device may automatically pause or loop the clip at the beginning of the interaction process, giving the user as much time as desired to complete their interaction. If the user chooses to review reactions, those reactions can be displayed over the related media segment, so that the user will easily recognize the particular segment or clip the reaction is associated with. If the virtual wall 100 is used, instead of a single screen to contain all reactions to an event, chapter, show, etc., the client device displays one screen per segment or shot, not only tying the reactions to a specific shot or scene, but perhaps more importantly, also offering more room for each reaction (e.g. one area per scene, segment or page, versus one area for the entire event). In addition, users providing feedback are not forced to race to react or consume reactions while the video is advancing.

The client device may generate a chat room, or other environment suitable for commentary and reactions, such as the chat overlay 315. In various embodiments, the client device transforms each clip or short video into a background video with sound, as a background for the chat room. Each media item acts as a chat room or a messaging area for all ratings, votes, polls, comments, reactions, information or purchase requests, etc. In some embodiments, the systems and methods of the present disclosure provide a chat room associated with each media item. The systems and methods may receive text comments, images, audio or video reactions to the media item and display the received reactions over or near the media item. The systems and methods may be coupled to one or more social graphs.

In some embodiments, if a user begins to enter a reaction about one clip, or is reviewing reactions about one clip, the client device does not advance to the next clip until the user has completed creating or consuming the reactions, and, instead either pause the underlying media, or in one or more embodiments, loop the underlying media during the creation and review of reactions pertinent to that clip. Once the clip is complete, and all desired reactions are reviewed, the client device automatically advances to the next clip.

A disadvantage of displaying reactions over media is that the clutter or noise may be annoying. In some embodiments, the client device determines actuation of a button or gesture, such as a long tap or force tap, and in response hides or suppresses most or all the overlay items (for example chat overlay 315), and actuation of another button or gesture, such as any tap, re-displays the overlay interfaces. In conjunction with the virtual wall, in one embodiment, once the overlay interface is hidden, the overlay interface remains hidden until the sequence or 'row' of the virtual wall has completely played, or until the overlay interface brought back manually. In another embodiment, the overlay interface remains hidden across multiple virtual wall strips, until brought back manually.

Various embodiments enable playing reaction audio or video. In one embodiment, the client device auto-plays all un-played, on-screen reactions (audio or video), from the top, down, unless interrupted by user action or other events. After auto-playing the reactions over each entry, the client device resumes auto-move. In another embodiment, the users determines if and when they want to trigger play of reactions via a button, gesture or voice command. In one embodiment, as each reaction is played, the reaction scrolls up, and if the reaction scrolls up and out of the reaction window, the reaction disappears. In some embodiments, the client device may provide an option for each user to adjust their reading speed.

In some embodiments, reaction videos or audio play at a normal or predetermined pace. In some embodiments reaction videos or audios play back faster, either by a system default or a user preference. In some embodiments, users can select specific reactions to play or replay by tapping on them, or scrolling to them and then tapping.

In some embodiments, the system stores data associated with which reactions have been played, and sets the scroll position of the reaction window so that the highest un-played or un-seen reaction is displayed. In response to the user leaving an entry or media item, and later returning to the same entry or media item, the client device starts auto-playing the reactions on the next un-played or un-viewed reaction.

If all reactions have been played, and a new reaction is received by the client device associated with the currently viewed media item, in a preferred embodiment, the client device plays the new reaction as soon as possible, or immediately after completion of playback of the currently viewed reaction. In response to receiving a plurality of new reactions, the client device plays the plurality of new reactions in sequential order. If new reactions are available to play, the client device may skip down to the new reactions.

In one embodiment, once a user creates a reaction, the created reaction is displayed in the chat overlay 315, or user's comment stream, and immediately played. In some embodiments, the reaction is created on the client device, and displayed by the client device via the graphical user interface upon creation, whether or not the created reaction has been transmitted to the server.

In a preferred embodiment, a user selects which reaction to play by tapping on the reaction in the chat overlay 315. In response, the client device plays the reaction, and/or if necessary, stopping the playback of some other reaction.

While the time to review audio or video reactions can be equated to the length in time of the media, a particular consideration is how much review time is needed for text comments or images. In one embodiment, the review time is based on an approximated length of time to consume the reaction. If this time estimate is too high, and the viewer does not which to wait, in response to a simple flick, or other gesture or indication, the client device will advance to the next entry or scene.

The user may take longer to see, read or digest the additional or overlay information than the time to see the image or watch the underlying video of the media item. If the additional information is already timed, such as an audio or video clip, the time to play this information can be considered. If the information is static, the client device may determine a number of words, letters or other information symbols, or lines, and from this determine a display duration such that the user has enough time to consume the information. In certain embodiments, the display duration is the amount of time a media item is displayed before advancing to the next media item. For example, in the case of English text, the client device may determine the duration to display the media item and extend the duration for addition information over that media by example, for three seconds per line to be read, or a tenth of a second per letter to be read. In the example, if there are one hundred letters in additional information displayed over the media item, then the methods display the media for at least one hundred multiplied by a tenth of a second, or ten seconds.

In order to further simplify the display, not all layered information may be displayed or played at the same time. For instance, we may want to restrict the display of layered information to a certain window 320 of the graphical user interface 300. As sufficient time passes to consume that information, the informational layer can scroll up, so that additional information can be seen or heard. A related problem is, if there is more layered information than can fit on the screen, where to start the display of this information. One approach is to start at the top, and scroll down as sufficient time to consume the layered information has passed, or to give the user manual control over scrolling layered information. In a preferred embodiment, the user is given manual control, and the client device advances the layered information at a rate which the user can adequately consume the information, and if there is more information than easily consumed, the client device prioritizes which layered information is displayed, and displays the most recent information, or most important, as appropriate.

In some embodiments the client device may adjust the duration of a media item such that the user can digest additional information on a first view, but on repeat viewings allow less time to review already presented information. The system determines which information displayed on a media item is new additional information or previously presented information. In response to a user viewing information displayed on an media item, the system records in a database whether the information has already been viewed or not. New information (e.g. has not been presented) is given a full amount of time to digest per unit of information. Information that has already been presented is given less time to digest. In certain embodiments, the amount of time may be the length of the audio or video commentary, or a number lines or words per seconds. For example, new comments may be allocated one second per word to read or review, but previously seen comments may only be allowed one second per three words. If the display of information is scrolled, this timing information can be used to control the scroll rate.

A concern of automatically advancing media is that sometimes users need to interact with the media item or the media application, for instance to add a comment, rate the media, vote, like or delete the media, such that the media remains on the current view while the user is attempting to interact with the media. One solution is to pause the media during any user interaction. However, pausing will stop the media playback, which is not always desirable. In various embodiments, the client device extends the time before advancing to the media item by looping the media instead of pausing the media. In the preferred embodiment, if the part of the media is still visible the client device continues to play the media, looping if necessary, but if the media is entirely covered by other aspects of the application, the client device pauses the media, and restarts play once the media again visible or partially visible. The client device detects user interaction. In response to detecting user interaction, the client device extends the display duration of the media item, and continues to extend until the user interaction is completed. For example, if a user brings up a menu that does not entirely cover the media, or triggers a vote animation, the carousel does not advance to the next media item until the menu is closed or the vote animation is complete.

A further concern of automatic advancement through potential video choices is that users need a reasonable amount of time to make a decision. For instance, a quiz or game show may desire to give the user eight seconds to make a decision about which selection to choose. In some embodiments, the client device determines if a total duration to display every media item in a carousel is less than a predetermined duration indicative of the amount of time a user needs to make a decision. The client device may determine the total duration by summing the display duration of each media item of a carousel, which may include short audio clips, videos or photos with short delays. If the total duration is less than the predetermined duration to make a decision, then the client device repeats the media sequence until the predetermined duration is reached.

In various embodiments, if the predetermined duration is reached but the media has not reached an end of playback, then the media repeats playing until the end is reached. If the user wishes to accelerate the process, she is able, using the virtual wall mechanisms described herein (or other, common mechanisms) to skip ahead.

Unlike traditional approaches which are designed to navigate and display passive media, approaches of the present disclosure are designed to navigate and display active media, media with additional commentary or feedback, which is more complex and requires new solutions. The system of the present disclosure facilitates viewing both passive and active media. The user may interact with the content, as long as desired, without preventing the content from advancing when the user is passive. The client device comprises a video time (VT) and a minimum time (MT). The video time represents a length of time of a media item, if a video, or the minimum time, that is a predetermined period of time, such as a few seconds, if the media item is an image or other static media.

Furthermore, certain actions may delay the next auto-move. The timer for auto-move is referred to as an auto-timer, and the time to hold on an entry is referred to as an auto-delay.

Some actions, such as voting or closing the on-screen keyboard (OSK) or menu, trigger a reasonable minimum delay or grace period before auto-moving. These actions reset the auto-delay=Max (current auto-delay, MT).

Auto-delay is the length of time the system remains on a media item before auto-moving. The minimum auto-delay of videos or audio is the duration of the video or audio. For photos or rich pages, the minimum auto-delay is set appropriately by the client device based on how much time the creator wishes to give, by default, to the viewer. In some embodiments the minimum auto-delay is a fixed amount for all photos or by line of text. Additional time may be added to consume comments or other reactions to the media. If the video finishes playing before the auto-delay is complete, the client device may either repeat the video or pause. In certain embodiments, in response to a gesture or interface element, the client device prevents auto-moves, such gestures may include holding a fingertip on the image or video, or other suitable gestures.

Unread comments or unseen reactions may extend auto-delay for sufficient time to read or process the unread comments or reactions. The client device may determine the sufficient length of time based on the time, size, rows, length or type of unread comments or reactions. If there are more unread comments or reactions than can be displayed on one screen, the client device may exclude them from determined length of time to extend the auto-delay.

Various actions may interrupt/extend the auto-timer. The client device pauses the auto-timer (but does not turn off auto-move indicator) during the interruptions. In response to an end of the interruption, the client device restarts the auto-timer. Some interruptions reset the auto-timer. In resets, if the auto-time remaining is less than MT, the client device resets the auto-time to the MT. This is referred to as resetting the auto-timer.

Figure 7:
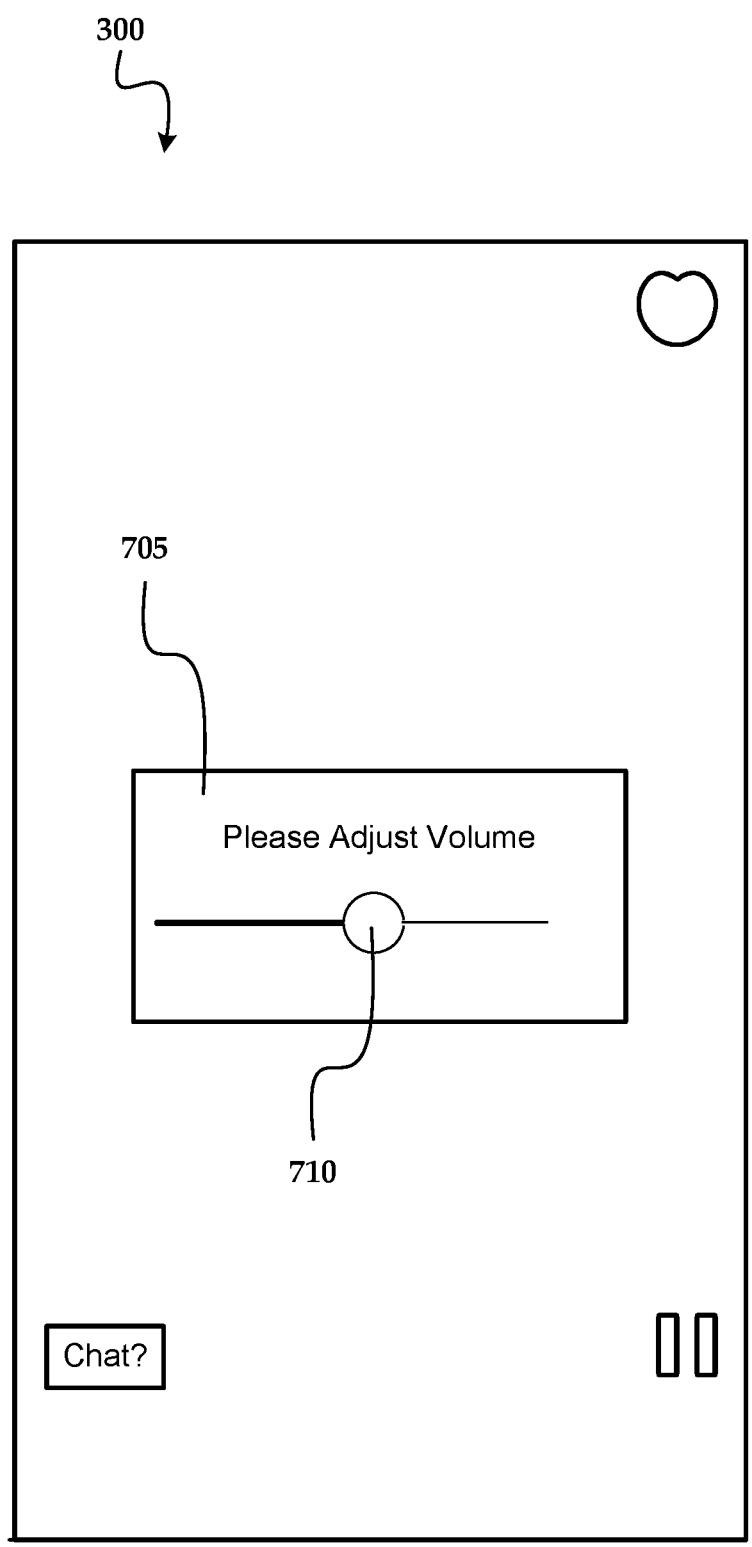
FIG. 7 illustrates the graphical user interface having a prompt with a slider for adjusting an audio volume setting of the client device, according to the present disclosure.

FIG. 7 illustrates the graphical user interface 300 having a prompt 705 with a slider 710 for adjusting an audio volume setting of the client device. The client device may generate and display the prompt upon opening the application, or returning to the application from a different application. In some embodiments, an audio volume setting of a media item is reduced by a predetermined amount if the media item is played repeatedly. While audio may greatly add to media experiences, sometimes the audio can annoy the user. For example, when short media loops, the sound track often becomes annoying on the second, third or later loops. The client device may automatically reduce the audio volume setting of a media item if the media item is looped or repeated. In some embodiments, the audio volume setting of the media item is dropped fifty percent each time the media item is looped.

Figure 8:
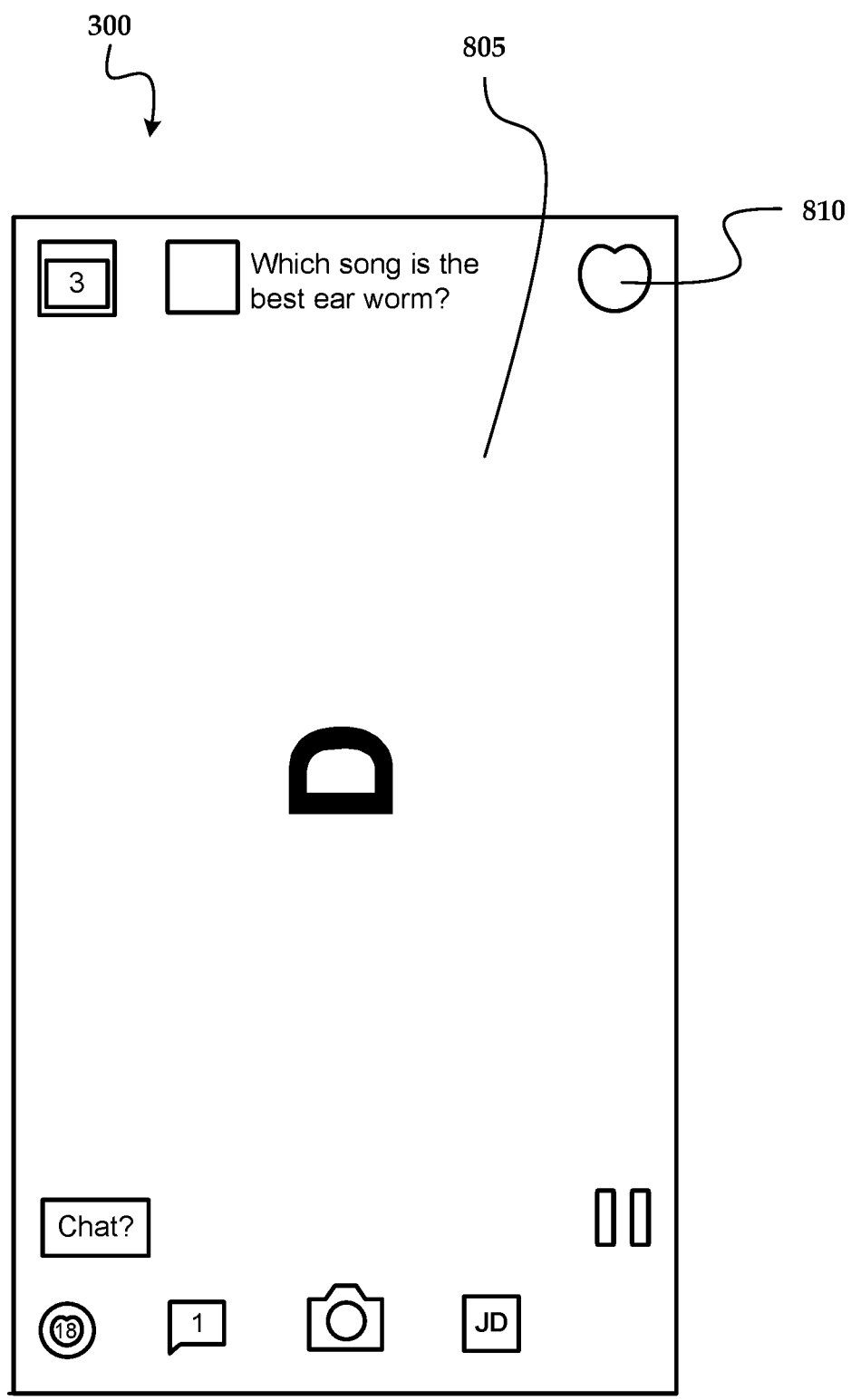
FIG. 8 shows another exemplary graphical user interface, according to the present disclosure.

FIG. 8 shows a media item 805 as a landscape video. A common issue of applications that play media is that the media may not be formatted to perfectly fit the form factor of the replay device. In various embodiments, the client device displays portrait media in portrait mode, even if the display is in landscape mode, and landscape media in landscape mode, even if the display is in portrait mode. As shown in FIG. 8, while the device is oriented in portrait mode, and all of the interface elements on the graphical user interface 300 are oriented for portrait mode, the media item 805 is shown in landscape mode. In other words, the user interface may be displayed normally, while media is rotated sideways. In some embodiments, the client device rotates the media if the rotated orientation enables a significantly larger image (for instance 25% more pixels). This non-intuitive rotation helps preserve the solidity of the virtual wall display.

In various embodiments of the virtual wall 100, the client device may display images and videos that are not shaped to match the shape of the screen with padding as necessary to avoid clipping the media. In certain embodiments, however, the client device may zoom up non-full screen images and videos to better preserve the solidity of the virtual wall display.

Figure 9:
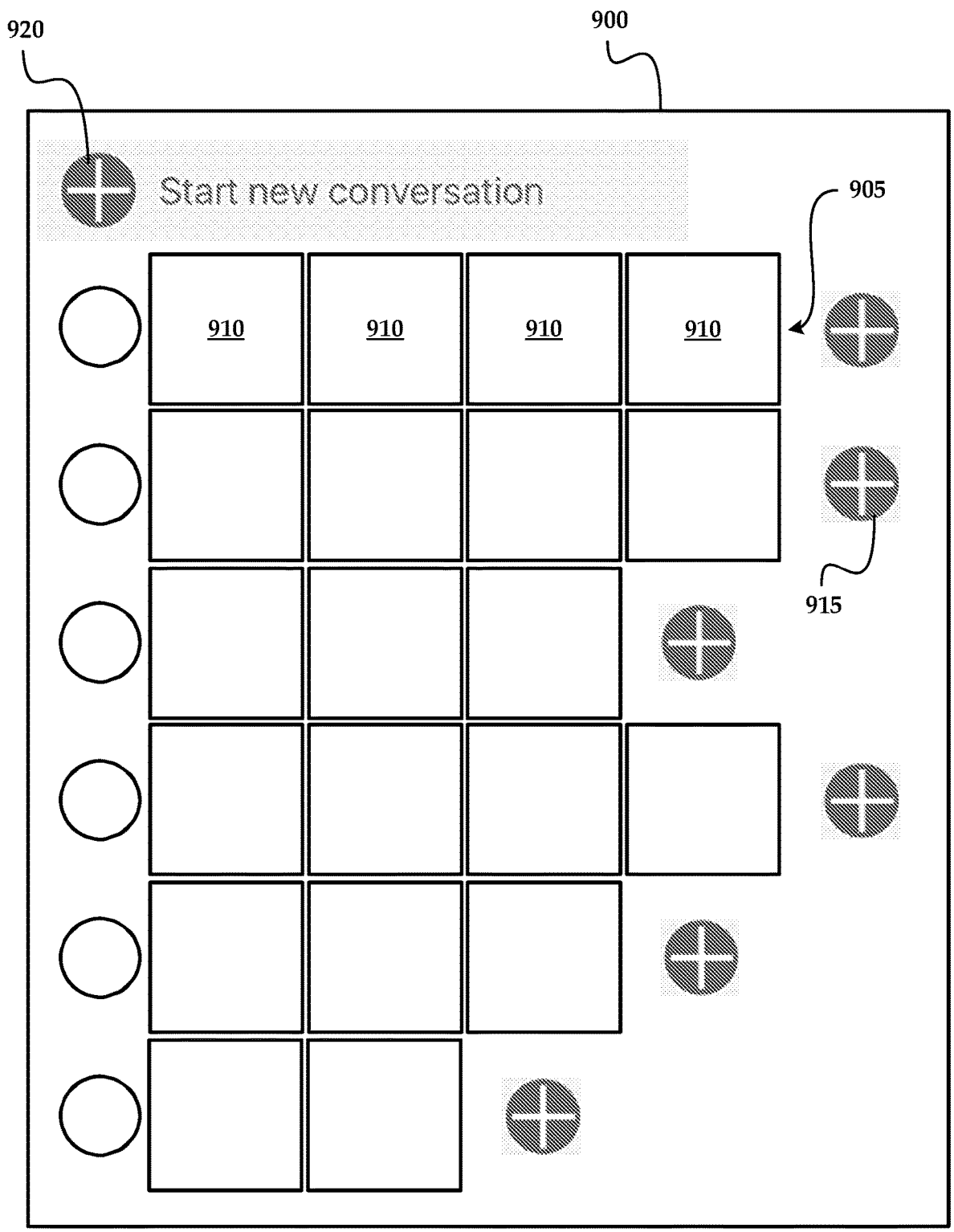
FIG. 9 depicts a representation of a summary of a virtual wall, according to the present disclosure.

FIG. 9 depicts a representation of a summary 900 of a virtual wall, such as virtual wall 100. An advantage of the virtual wall 100 is that the virtual wall 100 is easily summarized, by shrinking the full screen tiles or pages down to a fraction of their normal size, and trimming them, but retaining the same two dimensional layout of the full sized tiles or pages. For example, each carousel 905 may be arranged vertically, while media items 910 of each carousel 905 are arranged horizontally.

Another advantage of the virtual wall 100 is that it is easy to extend carousels by add additional pages or tiles to any horizontal strip. For example, the client device may determine an actuation of an add gesture, command or button, such as button 915, and trigger a prompt to the user to either select media stored in the client device or activate a camera to capture new media. The additional tile representative of the new media item may be positioned at the last or rightmost position, or immediately after the current tile, if that is desired. The buttons 915 represent placeholders for adding these additional media elements. In particular, if the media items in the carousel represent a conversation, adding new material or media to the rightmost position can intuitively continue the conversation. Furthermore, the summary 900 may include a button 920 for creating a new carousel 905.

The virtual wall 100 also makes it easy to remove individual media elements by removing or hiding specific tiles or pages, either from the summary 900 or the graphical user interface 300. Undesirable or removed tiles can be removed entirely, or quickly skipped over during transitions from one media item to the next, or blurred or covered up, as desired. A simple button (e.g. trashcan) or gesture (e.g. two finger pinch) can be detected to remove or hide unwanted media items.

Figure 10:
FIG. 10 illustrates various states of a carousel state indicator button, according to the present disclosure.

FIG. 10 depicts various states of a carousel state indicator button 810, as shown in FIG. 8. In certain embodiments, how a media consumer has responded to a media item is stored in memory and is displayed near or over the relevant media item as a carousel state indicator button 810. In particular, a method may include prompting a media consumer to respond to a media item. Upon determining that the media consumer has responded, the method may display what response the media consumer provided.

Referring back to FIG. 1, the virtual wall 100 in certain embodiments facilitates generating catalog navigation or shopping. In pre-existing methods, an online merchant user might present to the shopper one or more items of interest, and a selection of navigational elements to choose, for example, shoes, hats or coats. The user would click on various hotspots, some of which would hyperlink to additional pages. In a physical store, however, the user would walk in and see items laid out in groups, perhaps shoes in one area, hats in another, coats in a third. If the user was interested in shoes, the user would navigate to that section, scan through the items in some physical order, perhaps from left to right, or top down, etc., pick it up and examine it, and/or carry it to the checkout counter.

The virtual wall 100 can be used to offer a more intuitive catalog navigation or shopping experience. Each item in the catalog has at least one corresponding tile or page in the virtual wall 100. Each tile or page may comprise text, images or videos, or other suitable media. Each directory or group of items in the catalog has at least one corresponding tile or page in the virtual wall 100. Each directory maps to a row or carousel of the virtual wall 100. Large directories, in some embodiments, may map to multiple rows. The virtual wall 100 may contain any number of catalogs. Each catalog may consist of many directories and many items. To navigate through a catalog, in the preferred embodiment, navigating up, via an up gesture or other up interface element corresponds to navigation up one directory. Similarly, navigating left or right corresponds to navigation back and forth, through a directory. In some embodiments, large directories may also be navigated by up or down interfaces or gestures. If the currently displayed page or tile represents a group or directory, navigating down corresponds to going into that directory. If the currently displayed page represents an item, navigating down, in some embodiments, may correspond navigating to additional information about that item, information that may or may not be contained within the virtual wall 100. In the preferred embodiment, if the additional information is not contained in the virtual wall 100, a user interface element or gesture enables returning to the same spot on the virtual wall 100 with a flick up, or back gesture or button.

In some embodiments, navigating a virtual catalog may correspond to navigating a file system directory. In one embodiment, the top row of each catalog in the user's virtual wall 100 maps to the highest-level directory of the catalog. The highest level may represent a series of shops, departments, collections or other categories. The user, via the graphical user interface of the client device, may navigate through highest level of choices by flicking left/right/up/down through the series of large or full screen tiles, pages, images or videos, or using the other navigation interfaces described herein, or using a traditional navigation mechanism. In response to receiving a particular user input, such as a flick down or other suitable gesture or selection mechanism, the client device may select or 'dive into' a particular category associated with the displayed page or tile. In some embodiments, flicking up from the highest level exits the catalog, and returns the user to the carousel above the catalog. Navigating down, with the described virtual wall navigation elements, from a directory or collection displays the row or carousel that corresponds to the files and subdirectories or sub-collections of that directory or collection. Navigating down, from the bottom of a directory or file, in some embodiments, will display additional information on the item associated with the displayed page or tile, or work similar to a hyperlink, redirecting the client device to another page with additional information on the corresponding item.

If the user selects a subdirectory or collection in the first row, the virtual wall tile will transition and display information on the selected directory, collection or item, such as shoes, coats, and hats. The user may quickly flick through the second row of entries, and if interested in a particular entry such as shoes, flick down on the entry. For example, the entry associated with the shoes directory may depict a video, perhaps a video of someone spending a few seconds walking through the actual shoe department. For instance, a carousel associated with the shoe department may comprise three videos (or pages/tiles), one for sandals, one for boots and one for high heels. The user may quickly flick or automatically advance through the photos or videos in the strip, for example through to high heels. After diving into the heels entry, the client device may present the user with various brands of heels with another horizontal strip or carousel of full screen pages or videos. The user may quickly flick or automatically advance to the brand of interest, and again flick down to dive in further. The client device may then present a horizontal strip of models of that brand. Again, the user may select a particular model by flicking down. The system may then present a horizontal strip of choices related to that item, for instance colors. In response to the user flicking down or otherwise selecting a color, thus completing the selection process, the system may present a choice of checking out (the screen might again slide down) or continue shopping (flick in any other direction). To exit the store, the user could flick up until they get to the 'mall' level, or tap the leave button, or use other traditional methods to exit, such as selecting home. If the user exited the virtual 'store' with items in their 'shopping cart' upon exit from the store, the user could be reminded to 'check out' via various suitable interfaces.

In various embodiments, the virtual wall 100 is used to display a catalog of pages, images or videos, which may correspond to product or service offerings. In one embodiment, the catalog is mapped to a directory structure. In this mode, traversing left or right through the virtual wall 100 maps to traversing through a particular directory. The order of the items in the catalog may be set, or sorted by a value, like importance or alphabetical. Traversing up the virtual wall 100 maps to going back up through the directory structure. Traversing down the virtual wall 100 maps to going down through the directory structure. Directories may include files, links or additional directories. If the virtual wall item corresponds to a directory or link, then a preview video or image that corresponds to that directory or link is displayed in the virtual wall 100. If the virtual wall item corresponds to a file, that file is displayed, with additional metadata as appropriate.

If the user attempts to navigate down when viewing a file, which is the 'bottom' of a directory tree, various embodiments are possible. The simplest is stopping at the 'bottom' with some appropriate user feedback. In a preferred embodiment, in response to receiving a user input associated with navigating down further when viewing the bottom item of a directory tree, the client device displays additional information or actions regarding that item (which may include an interface to save or purchase the item or request additional information regarding the item), or navigating to a tile which asks the user what action he or she desires, or navigating to the next virtual wall item down past the current directory structure.

Figure 11:
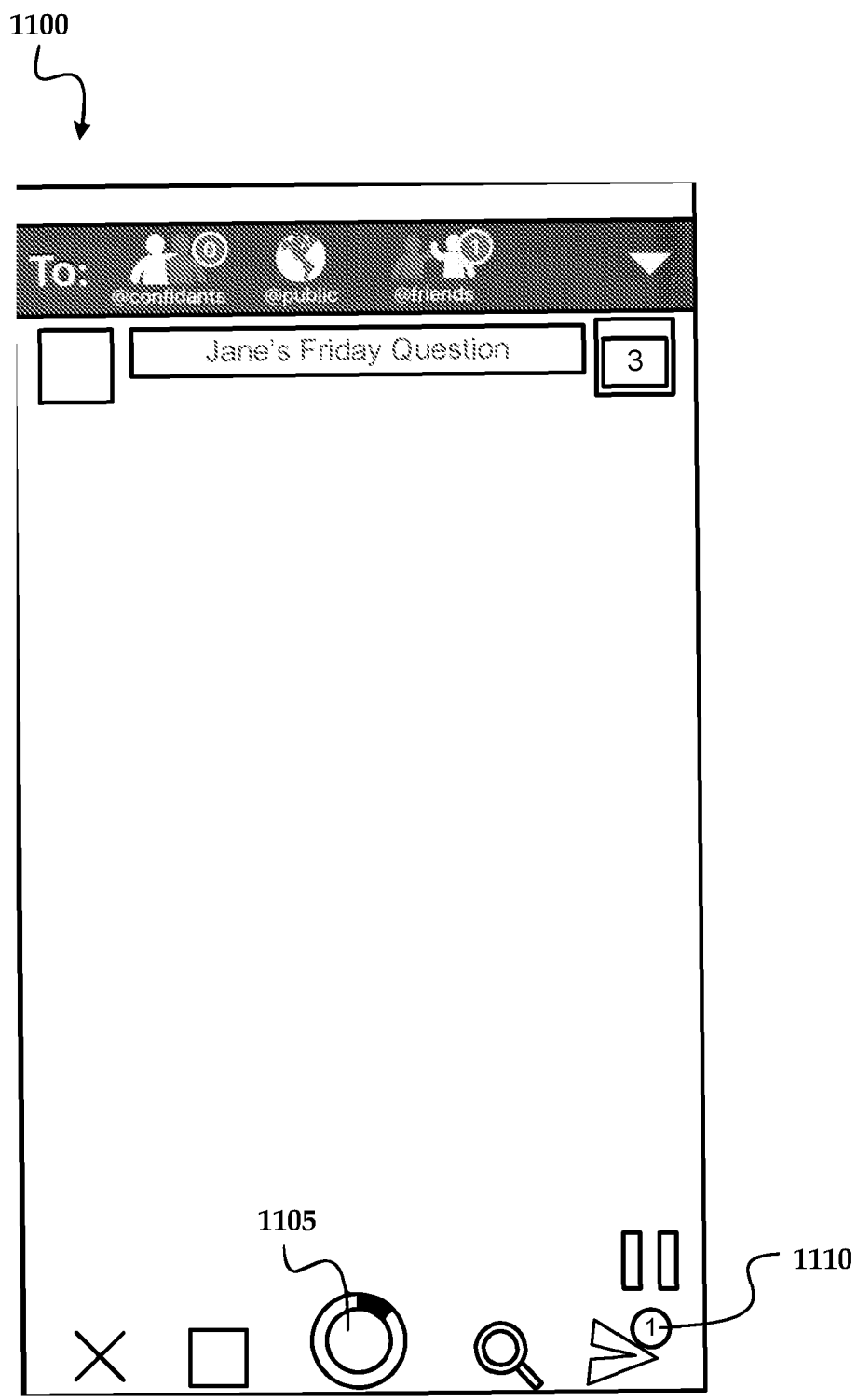
FIG. 11 shows a graphical user interface that facilitates media recording and sharing, according to the present disclosure.

FIG. 11 depicts a graphical user interface 1100 that facilitates media recording and sharing. A problem with capturing, editing or responding to video in real time is that humans need approximately 150 ms-200 ms to react to stimulus. If the user wants to create, split, trim an existing video, or restart video capture in real time, then a manual trigger action of the user may be delayed by one or many video frames from an intended initial video frame. In various embodiments, in response to a user starting a video, or marking a video to be split or trimmed, the methods record the manual marked time and subtract a predetermined reaction time. For example, a predetermined reaction time may be 150 ms. Any time mark used to start, split or trim video, the methods may incorporate the predetermined reaction time into account, so that the start/split/trim is based not on the manual touch time, but that touch time less the predetermined reaction time.

In various embodiments, the client device facilitates splitting long videos into short shots or segments, suitable for interaction including commentary. In one embodiment, after a reasonable amount of recording time for one shot, perhaps 15-60 seconds, the client device may split the recording into an additional recording, or provide standard tools to splits longer shots into multiple shorter segments, or use other techniques to automatically generate at which points to split longer videos into shorter videos, such as silence detection. In some embodiments, in response to splitting longer shots, the client device may add one or more visual or sound effects, as each shot is first split.

Referring back to FIG. 11, the graphical user interface 1100 may include a send count indicator 1110 that represents a number of media consumers that the contest will be sent to and/or visible by. The send count indicator 1110 clearly shows the number of media consumers that the media creator is sending the contest to. In some embodiments, the send count indicator 1110 is represented as a badge over a portion of a send button.

Figure 12:
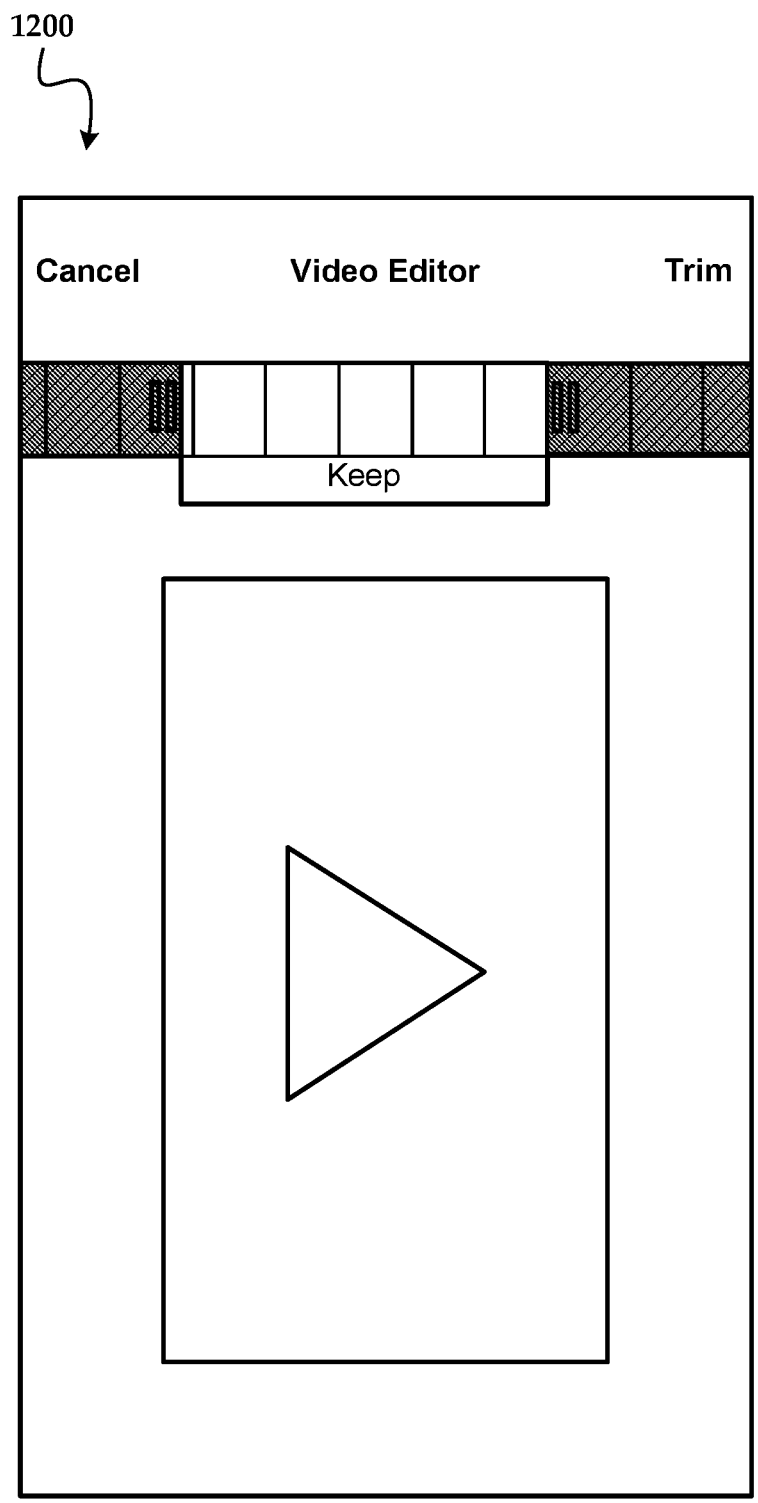
FIG. 12 depicts an exemplary graphical user interface that facilitates trimming videos, according to the present disclosure.

FIG. 12 depicts an exemplary graphical user interface 1200 that facilitates trimming videos. A single video trigger can capture time both before and after the trigger. For example, a video trigger can capture five seconds before the video trigger. Then, in some embodiments, the client device presents to the user, via the graphical user interface 1200, with an option to further refine the start or add additional chapter or split markers on the video with a video edit button. If the user chooses to edit the clip, the client device presents the user with the longer acquired video, with the trim points selected by default, and then gives the choice to move the trim points forward or backward, or add additional chapter or split marks.

In various embodiments, the present disclosure is directed to fast intra-video and inter-video navigation systems and methods. The traditional solutions are to navigate through programs, channels or video lists using up and down buttons, by entering channel names or numbers, or entering the name of the video, finding matching results and then selecting one, if there are multiple matches. Unfortunately, these are all poorly adapted for touchscreen devices. Accordingly, there is a need for the development of a system and method for navigation that provides ease of use across devices.

Figure 13:
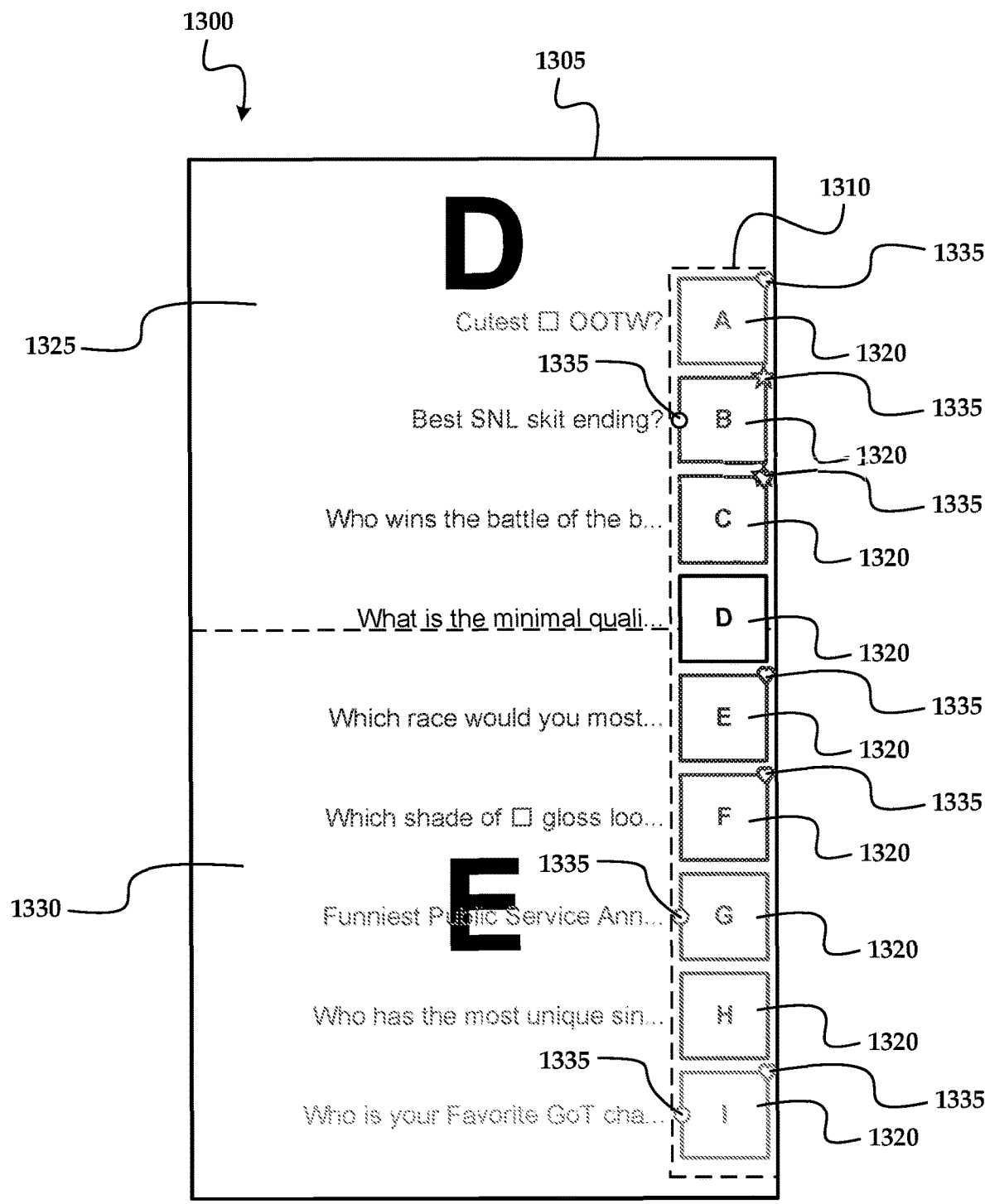
FIG. 13 illustrates a further exemplary graphical user interface having a vertical navigation user interface, according to the present disclosure.
Figure 14:
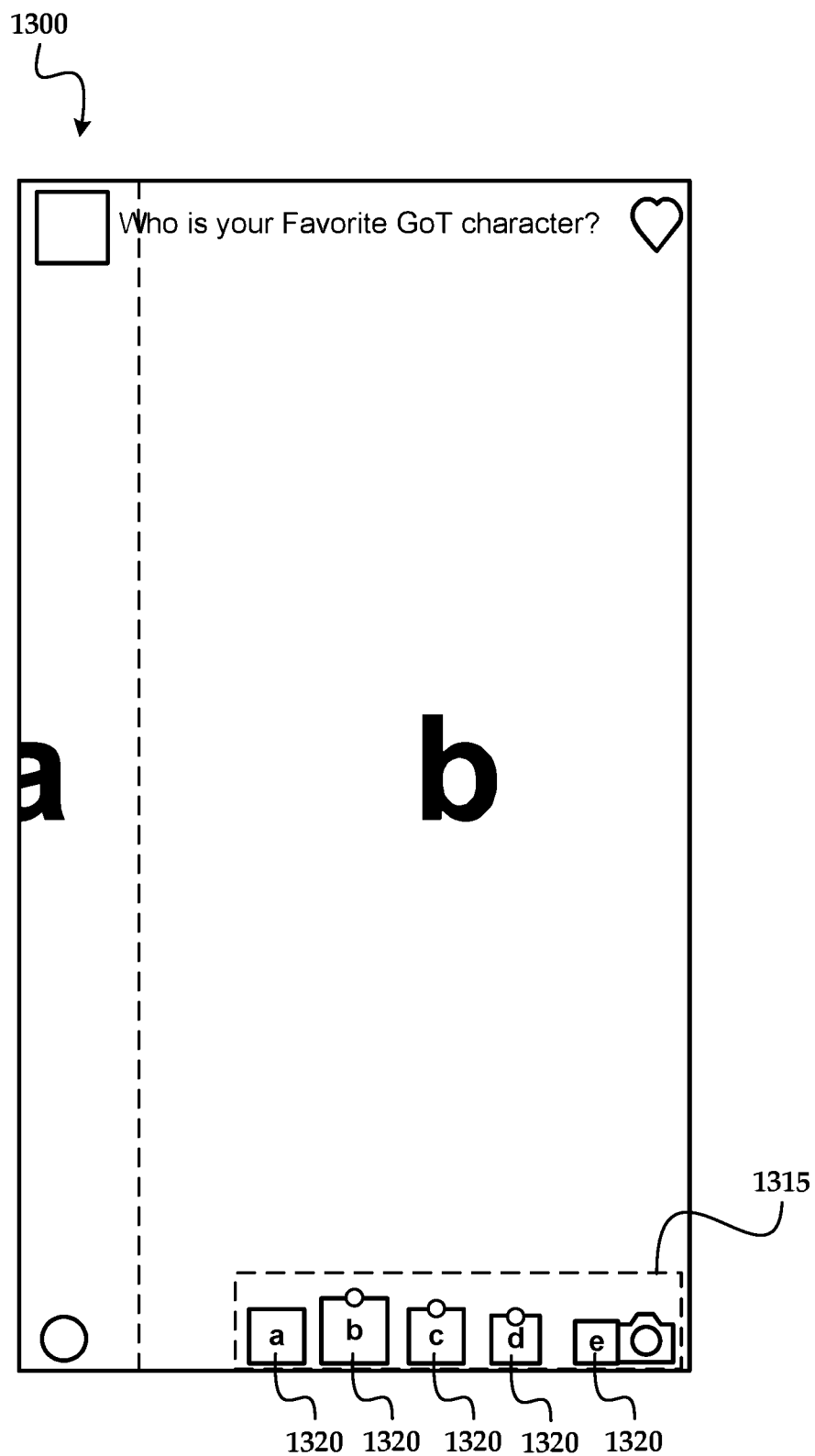
FIG. 14 illustrates a further exemplary graphical user interface having a horizontal navigation user interface, according to the present disclosure.

FIGS. 13-14 shows a graphical user interface 1300 having a main window 1305 through which a series of media is viewed. In various embodiments, the media, comprising images, video, etc., may be arranged horizontally or vertically, as described in other various embodiments of the present disclosure. Each item of media includes a position along a first axis. The graphical user interface 1300 may further comprise one or more navigation user interfaces, such as vertical navigation user interface 1310 and horizontal navigation user interface 1315, each navigation user interface having a plurality of previews 1320. The system couples a position of the main window with a position of the plurality of previews. In response to the user scrolling through the plurality of previews 1320, the position of the main window 1305 moves to match the position of the plurality of previews 1320. The client device coupling the main window 1305 to the currently selected preview of the plurality of previews 1320 facilitates speed and accuracy of media selection. For example, media item 1325 may correspond to the preview labeled "D," and media item 1330 may correspond to the preview labeled "E." The main window 1305 may contain either playing or stopped videos. The user may simply navigate through the plurality of previews 1320 and release when the desired choice is selected. It is to be understood that the user may scroll through the plurality of previews 1320 through one or more gestures on a touch display or a virtual reality or augmented reality display.

In some embodiments, the currently selected preview, while the user is navigating the plurality of previews, is highlighted (for example, preview "D" in FIG. 13). In response to the user releasing their finger from the touch display or otherwise finalizing the selection, the client device removes the navigation user interface 1310 and plays the selected video or continues to display the selected image. While the navigation user interface 1310 is displayed, the client device may darken or otherwise de-accentuate whole or parts of the underlying video (for example, the system may use a mask that is darker under the list than away from the list) to make it easier to see what choices the user has. In some embodiments, the system plays the audio track of the primary or secondary video, such as media item 1325 and 1330 respectively, or some combination, the selection of which may be a default setting or a user defined setting.

In some embodiments, the system provides annotations to one or more of the previews 1335 to clarify which media have already been played, been preselected by or for the user, are free or require payments, etc. As shown in FIG. 13, the annotations may include a dot to indicate new, heart to indicate favorites, etc.

FIG. 14 illustrates a similar navigation user interface 1315 for navigating within a video or sequence of related videos. Existing approaches use a fast forward or rewind button, or a timeline control used to move a video forward or backwards in time. The existing approaches are not suitable for fast and flexible navigation of media content on across devices.

In various embodiments, system includes a vertical navigation user interface 1310 or inter-video navigator (as shown in FIG. 13), and a horizontal navigation user interface 1315, or intra-video navigation user interface or intra-video navigator (as shown in FIG. 14). The vertical navigation user interface 1310 facilitates the user selecting a particular sequence of media or carousel from a plurality of sequences or carousels. The user or program may trigger or otherwise evoke the vertical navigation display by using a standard interface like a tap or swipe on an area of the graphical user interface 1300 that holds the vertical navigation user interface 1310. The horizontal navigation user interface 1315 is displayed on the graphical user interface 1300, the horizontal navigation user interface 1315 having a series of previews (or images) 1320 that correspond to a representative frame for that alternative spot or alternative video, or otherwise media items of the current carousel. It is to be understood that, while letters are shown as distinguishing various media items and previews for ease of illustration, the media items and previews would depict the underlying media, either as images, video, etc. In response to receiving scrolling, swiping or other suitable gesture or user input, the client device scrolls through the series of images which facilitates the user moving through the series of choices quickly.

Similar to the vertical navigation user interface 1310, the horizontal navigation user interface 1315 also couples the position of the main window 1305 with a position of the series of previews 1320. In response to either releasing a finger or pointer, tapping on a specific choice, or other suitable gesture or user input, the client device plays the selected choice. Similar to the vertical navigation user interface 1310, the horizontal navigation user interface 1315 facilitates viewing or watching the video and simultaneously selecting a new position in that video or other video.

In various embodiments, the previews quickly disappear once the selection is released, but not so quickly that there is not time for the user to pick up their finger or selector, and continue scrolling, dragging or selecting. For example, in response to a selection, the client device may wait a predetermined amount of time before hiding the navigation user interface 1310, 1315. This facilitates 'infinite' scrolling of choices, seamlessly.

Referring back to FIG. 1, embodiments of the present disclosure also may be combined with live audio or video, such as live video or live game broadcasts, referred to herein as a live event. In some embodiments, the virtual wall 100 is applied to the live event. Using the virtual wall 100, the current live shot is the rightmost tile or entry in the carousel or row that corresponds to that live event.

In some embodiments, the virtual wall 100 facilitates rewinding or 'going back in time' in the live event. If the user navigates to a live event, and goes to the right-most or last entry, the client device will present to the user a live feed. Otherwise, if the user navigates to any other entry for the live event, such as previous entries within a carousel associated with the live event, the client device will presented to the user one or more recording of the event in the past.

Users often will want to ensure they are watching the live component of a live event. The user may navigate to the rightmost entry to find the live or latest component as previously described. In some embodiments, in response to a user input indicative of navigating right past the latest or live entry on the right, the client device, instead of navigating to the next entry in the virtual wall, may display options related to the live stream, and/or synchronize the display with the live stream. However, user input indicative of navigating down to the next row of the virtual wall will navigate to that item.

In some embodiments, in order to turn a long event into a series of shorter shots or videos, suitable for a carousel or virtual wall display, the client device or server will either manually or automatically separate or split up a long video sequence into a series of shorter shorts. In some embodiments the client device generates a button or gesture, such as a shake gesture, to split the recording into another entry at the point currently displayed. Furthermore, the client device may utilize a timer to ensure that no single shot is too long. For instance, in response to a video shot reaching sixty seconds or other suitable predetermined length of time, the first sixty seconds is automatically split into two separate segments or shots. In some embodiments, a graphical user interface is generated and displayed by the client device to review sequences of shots and add, remove or change where the video transitions from shot to shot. In some embodiments, in order to highlight the live shot, a word or symbol is displayed by the graphical user interface over the entry associated with the live or present video.

In some embodiments, if the user pauses while watching a live event, the video is paused, and thus the user falls behind real-time. In a preferred embodiment, in response to the user un-pausing, the client device may play the stream where the user left off in a new media entry, and also generate a new media entry in the virtual wall to the right, associated with the live event. The user may then navigate or advance forward in time to catch up or join the live stream.

In some embodiments, instead of queuing up reactions, when watching live material it may be preferable to play reactions to that material live, as the client device receives the reactions. In some embodiments, the client device limits the number of simultaneous reaction, for instance, up to three simultaneous reactions. Additional simultaneous reactions, may be queued in the comment flow. Reactions may be prioritized, and low priority reactions may be skipped.

Furthermore, reactions to live audio or video is more complex, as delaying reactions may render them, if not pointless, at least out of synchronization from what the reactor intended. In typical systems, reactions received live during live broadcasts play as soon as possible. When too many reactions are received simultaneously the additional reactions are typically queued up and played later when there is time or space. However this technique has obvious limits as humans can only read or listen at limited speeds.

If a user is viewing a live-stream, and the live stream ends, but other related live-streams are presently streaming, the client device may advance a position in the virtual wall 100 to the next related live-stream. For example, if there are multiple live-streams of the same event, if one live-stream for that event ends, the virtual wall is advanced to the next live-stream of the same event.

In further embodiments, the live event may correspond to live video feeds from multiple screen captures or cameras, either associated with the client device or remote devices transmitting video feeds via a network and/or server. Referring to the virtual wall 100, each carousel may be associated with a particular camera, in which the last or right-most entry is a live feed, and previous entries are associated with previous segments of recorded video from that camera. For example, move/swipe/button left and right, or other suitable gestures or user input, are forward or back in time, and up and down user input switches the current display between cameras or screen captures recorded within the same event, and during the same time period as the recording above or below. The client device responds to such user input as previously described herein. Furthermore, a vertical navigator as shown in FIG. 13 may comprise small picture in picture images/videos as previews to display the live feeds received from multiple cameras.

Figure 15:
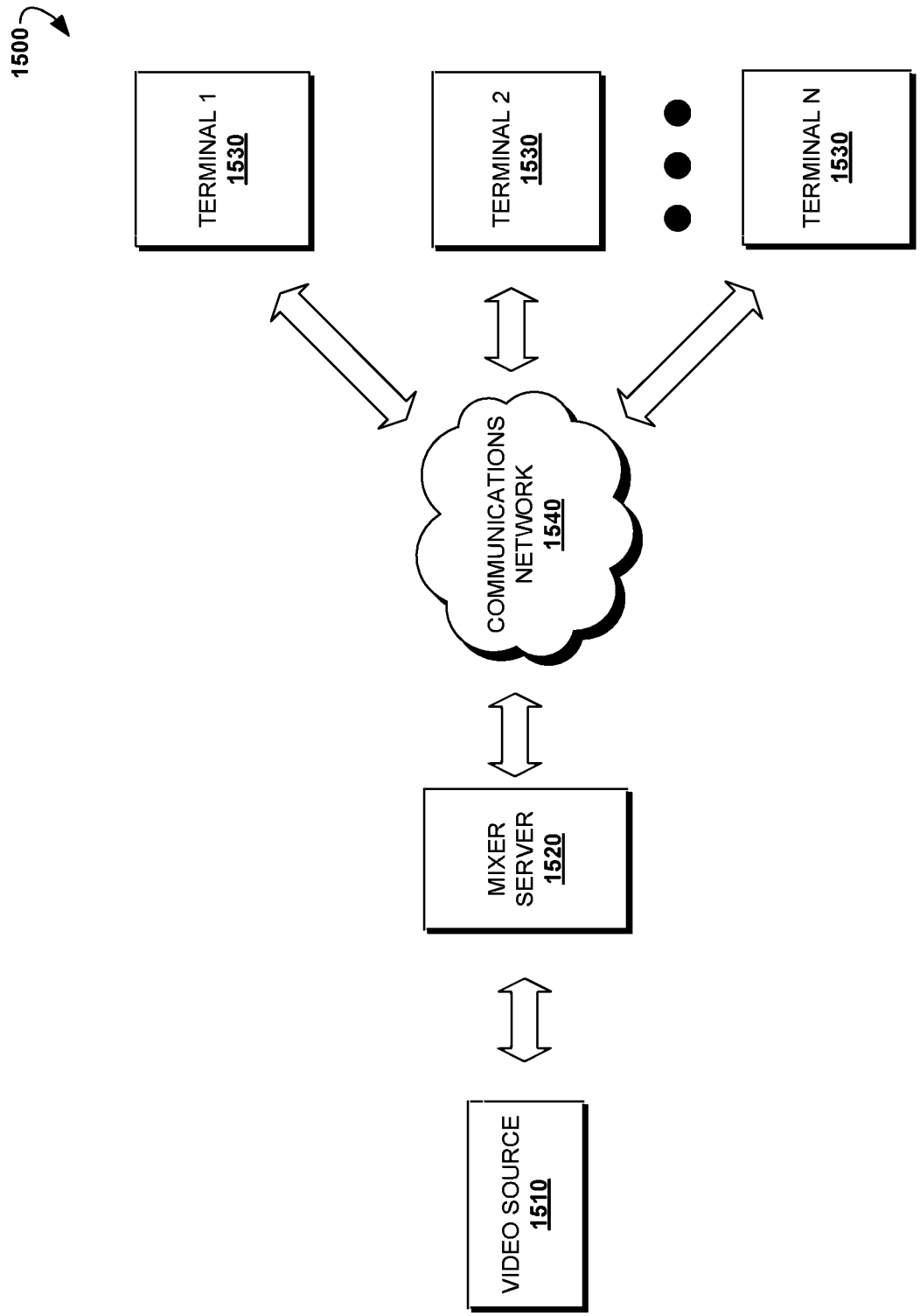
FIG. 15 shows a high-level block diagram of an exemplary video streaming system, otherwise referred to as a virtual stadium, according to the present disclosure.

FIG. 15 illustrates a high-level block diagram of an exemplary video streaming system, referred to herein as a virtual stadium, having a video or screen capture source 1510, mixer server or distribution point 1520, a plurality of terminal or client devices 1530, and a communications network 1540. The video source 1510 may be a live event or broadcast which is being transmitted to the mixer server 1520 over the communications network 1540, or alternatively may be a pre-recorded video either transmitted to the mixer server 1520 or hosted at the mixer server 1520. There may be separate video servers for the primary event, and as well as audio mixing servers for the rooms and crowd. For instance, audio servers could be closer to the crowd than the server transmitting the video source. Screen capture or video capture is available.

Currently, a popular form of virtual audience participation in mass media is the text message or some form of "like" button. Typically those text messages or "likes" may be displayed over or near the media.

Embodiments of the present disclosure take fundamentally different approaches to audience participation. Instead of only presenting user feedback as text or symbols, the virtual stadium also harnesses audio. Using audio, users may see a performance without text messages or other symbols covering or distracting from the performance, while hearing and feeling the presence of the audience.

For each virtual stadium 1500, the system involves a multiplicity of virtual participants, each virtual participant (or audience) associated with client computer hardware, such as a mobile phone, headset, computer or media player, some of which are equipped with one or more microphones, connected to a network. The client device associated with each virtual participant may be referred to as terminals 1530, collectively referred to as the audience. Using techniques known to those skilled in the art, participants receive the media, whether created almost live or previously recorded, at approximately the same time, such as TV broadcasting, internet broadcast, or other mass media distribution systems. Zero, one or many participants may have active microphones recording their audio reactions to the mass media as the participants experience the media.

In some embodiments, the audience may be presented, via the terminals 1530, with buttons or gestures to activate other audio reactions, such as applause, booing, cheering, etc. For instance double tap may trigger clapping, a hard tap a cheer, a shake—booing, a drawn heart—a kiss sound, etc.

Microphones may be turned activated or turned off by various well known mechanisms, either automatically or manually, by such standard methods as push to talk, turning on or off a microphone button, voice or volume detection, etc. The microphone(s) capture live audio, typically the user's voice and other sounds picked up by the microphone(s). The client device(s) may process the audio input to improve a signal quality or transmission efficiency of the audio input, using the methods of echo removal, volume balancing, compression, etc. known to those skilled in the art.

The audio signal may be time-stamped with the time of origination to facilitate processing later in the mixer server 1520. After audio processing on an originating client, the originating client sends the audio input, via the communications network 1540, to a server or collection of servers referred to as mixer server 1520. To facilitate analysis or mixing, the audio may be sent uncompressed via the originating client. To facilitate transmission, the audio may be sent compressed via the originating client. In some embodiments, the audio signal can be sent both compressed and uncompressed to optimize processing speed over bandwidth. The audio input may be sent as a file, stream or other standard methods.

The mixer server 1520 receives a multiplicity of audio inputs for the virtual stadium from the client devices 1530. The mixer server 1520 mixes together the audio inputs, also referred to as streams, as appropriate, and sends one or more streams back out to all clients who are listening to the virtual audience via client devices 1530. Feedback servers may be separate from broadcast servers. In response to receiving the streams, the client device 1530 plays both the mass media, and virtual audience participation audio, which may be in separate streams, or mixed together into a single stream, in approximate synchronization to create the effect of an audience providing nearly real-time audio feedback to the media. If gestures or buttons are used to create other sounds, the other sounds, in a preferred embodiment, are synthesized using standard methods, such as playing a digital recording of the sound. In such embodiments, triggers for generating the synthesized sounds are received by the originating client device and sent from the originating client device though the communications network 1540 to the mixer server 1520, which mixes the synthesized sounds into the virtual audience participation audio. To minimize overhead, the mixer server 1520 may accumulate or sum the synthesized sounds into counters, and the counts of the synthesized sounds may be sent instead of the synthesized sounds themselves.

Complex issues may arise if, for example, hundreds or audience members are making noise, and thousands are listening. In one embodiment, the mixer server 1520 may create a single 'crowd' mix. The mixer server 1520 combines all audio input equally and transmits the combined audio input to all clients who have indicated their desire to play the crowd sound.

Unfortunately, many voices make it difficult to hear any particular voice, such as the voice of a close friend. To mitigate this problem, in some embodiments, audio from a limited number of selected users, or 'voices', are sent directly, peer to peer, or indirectly through the server(s), using standard methods, in a separate mix or channel, to all participants, or just selected participants, so that the volume of these selected voices can be controlled separately, and if necessary, the volume of selected voices boosted, or the volume of the crowd reduced or 'ducked' so that the selected voices can be understood. If too many voices are sent simultaneously to be understood, then the number of selected streams may be throttled back to a reasonable maximum, say less than four voices. In some embodiments, the audio for a group of friends could be given a separate channel or mix, to facilitate these friends to talk to each other, over the noise of the crowd.

In some embodiments the mixer server 1520 counts a number of voices by determining a number of received audio input streams from the terminals 1530 and prioritizes the individually received audio input streams based on various criteria, such as how close the virtual speakers are to the virtual listener, either in location in the virtual stadium space, in distance in the listener's social graph, etc. In some embodiments, audio from close friends could be prioritized over audio from acquaintances.

In some embodiments, virtual participants automatically or manually select a virtual location to speak or listen from via each terminal 1530. In some embodiments, the mixer server 1520 assigns each participants a virtual 'seat', a location in a virtual two or three-dimensional virtual space.

In some embodiments, the mixer server 1520 assigns a virtual participant to one or more virtual rooms. Virtual participants in the same virtual room would hear each other at a normal volume. Users in other virtual rooms would be played at a reduced volume. The mixer server 1520 may combine audio inputs from terminals 1530 of virtual participants in the same virtual room into a single virtual room audio stream, adjust a volume of the audio stream, and transmit the audio stream to the terminals 1530 associated with the virtual room. In certain embodiments, the volume, stereo mix, head related transforms, room parameters or other standard spatial audio techniques can be used to create the effect of a virtual room or space.

Depending on the number of participants, it may be difficult to create a unique audio mix for every participant. In order to increase efficiency, the audio of participants who are not near in the virtual space can be mixed together into a single stream or several streams. The audio of nearby virtual participants, or participants who are loud enough to be understood, which may be defined as a predetermined virtual distance or virtual room, are separately mixed, using standard mixing techniques. In the preferred embodiment, nearby or important virtual participants will be louder than more remote or less important virtual participants. Finally, the nearby and not near mixes are mixed together for a final mix and played on the client device. It is to be understood that the mixing can take place in any device with sufficient computational power.

For a user, it is useful to see the person who is talking, for instance, in the event that the user wants to respond directly to that person, or mute that person. In some embodiments, when specific voices are transmitted at sufficient volume to understand them, the name or avatar of the speaker may be displayed. This visual representation can then be used as a button to trigger additional information or interfaces relating to that speaker, to review or replay their audio, to have a private conversation with that speaker, to change that speaker's volume or mute the speaker, to block the speaker, etc.

One complication of audio mixes is that people do not like to hear themselves delayed by more than a few hundred milliseconds. In room or location based mixes, if everyone in the location or group receives the same mix, then people may hear themselves, perhaps significantly delayed. In some embodiments, when a client transmits audio, the exact timing of that client's audio is recorded by the client and transmitted with the audio. Before playback, on either the client or the mixer server 1520, the client's own audio stream is subtracted from the mix.

In some embodiments, all clients in a virtual room who are not transmitting audio receive the same virtual room mix, but all clients in a virtual room who are transmitting receive the unmixed streams of the other priority transmitters, and then, either on the client or the mixer server 1520, the transmissions are mixed, so that the transmitters do not play their own transmissions.

Alternatively, in some embodiments, the virtual room can be split into two or more virtual room mixes, one for half the participants in a virtual room, half for the other. The mixer server 1520 sends the mix of a first half of the virtual room that does not include the participant's own audio and then unmixed streams of the priority transmitters from a second half of the room that does include the participant. Further division of the virtual room into smaller fractions is possible in other embodiments.

In a preferred embodiment, each participant is placed in a virtual room, with a limited number of participants, for example up to one hundred participants. Thus if there are fifty thousand total participants, the fifty thousand participants might be split into hundreds of virtual rooms, for example five hundred virtual rooms. The audio streams from all members of each room would be collected by the mixer server 1520, and mixed into a single mix per room.

To create a mix for the entire virtual stadium 1500, the mixer server 1520 combines all the room mixes in a single stadium mix. Alternatively, the mixer server 1520 could divide up the stadium into two or more mixes. Multiple mixes ensures that the mixer server 1520 is capable of sending to the client at least one mix that does not include that client's own 'voice.' The clients own virtual room mix may then be processed separately via the mixer server 1520. Finally the virtual stadium mix and the virtual room mixes are combined on the client or mixer server 1520 to produce the complete participant mix associated with an individual participant.

It is to be understood that the techniques described herein may be combined. Virtual rooms or participants may be given positions in virtual space, so that nearby virtual rooms or participants can be spatialized, using standard spatialization techniques, but other rooms, too far away to benefit from spatialization, be treated as simple ambient mixes. In some embodiments, participants may be allowed to move within the virtual room to 'talk to' specific individuals within the room, for instance by selecting any empty chair, or by navigating in a virtual space, using a standard seat selection interface, or other standard ways of positioning themselves in a virtual space. The client device may receive a seat selection or user selection, and transmit a position of the seat selection or a user identifier to the mixer server 1520. The mixer server 1520, in response to receiving the seat selection or the user identifier, may separately mix an audio stream associated with the user identifier, or may store the position associated with the client device into memory.

In some embodiments, the client device may generate a graphical user interface having one or more indicators and controls for the volume of the virtual stadium, virtual room mix or synthesized sounds. The graphical user interface may be one of many standard volume control interfaces, such as a slider or number, or it can be automatically balanced, lowering the virtual stadium sounds to ensure that priority participants can be heard. In some embodiments, the graphical user interface includes one or more indicators and controls for selecting a virtual room. The client device or mixer server 1520 may assign or suggest to participants a preferred room, in some embodiments, based on which virtual room most of the friends or acquaintances of the participant are already in. In other embodiments, other participants may invite them to specific rooms, for instance the room the other participant has already selected.

Like real events, virtual events in virtual stadiums can be recorded and replayed. In a preferred embodiment, the audience participates in the event as it is first broadcasted to that audience, in real time. However there also may be an audience for replayed events, or selected clips from recorded events. The original or first audience response recording, if requested by the client, can be played in near synchronization with the event replay.

A participant may not want to hear certain users. In some embodiments, if one participant indicates a particular user to mute or block, either permanently or temporarily, via a graphical user interface of the associated client device, for instance for the duration of the event, the client or mixer server 1530 may not play, or not transmit, or subtract out the audio stream from the particular user's client device from the mix.

An "usher" or event producer may wish to mute certain users, sections or rooms. In some embodiments, if an event administrator indicates a particular user or room to mute or block, either permanently or temporarily, via a graphical user interface of the associated client device, for instance, for the duration of the event, the client or mixer server 1530 may not play, or not transmit, or subtract out the audio stream of that user, section, or room.

In various embodiments, the mixer server 1520 expands the available 'room' by creating multiple virtual (chat) rooms. As in other methods for audience participation, the mixer server 1520 can use several various embodiments to assign users to virtual rooms, for instance, randomly, or by who invited them, or by which room contained the most friends, etc. In some embodiments, the mixer server 1520 collects the best content, or highest rated content, from the various rooms and promotes them to a final summary, or other rooms.

Significant delays between viewing an event, and responding to that event, are generally undesirable. For instance, if laughs for a joke come in after that joke has ended and the next joke has started, the experience is less enjoyable. Delays exist between each transmission in the virtual stadium 1500. For example, a delay exists from an event in the video source 1510 transmitted to, via the mixer server 1520, the terminals 1530. Another delay occurs between a user receiving the received video and audio signal and their audible reaction to the signal. Finally delays may occur from recording the user audio stream, transmitting the audio stream to the mixer server 1520, mixing the appropriate audio streams together into single or multiple channels, and transmitting the final mix or mixes back to the terminals 1530. Embodiments of the present disclosure minimize the delays from the initial event to receiving participant reactions to the event.

In various embodiments, all client clocks are approximately synchronized, using one or more techniques described herein or any other suitable pre-existing techniques. If the mixer server 1520 receives a media signal from one or more terminals 1530 too late, or past a predetermined cutoff, for instance, two seconds, the late audio feedback from the one or more terminals 1530 is ignored or otherwise not included in the mix. If the media is not too late, then the terminal can transmit audio back to the mixer server 1520. In certain embodiments, the mixer server 1520 determines a particular time window associated with an event, such as a touch down in a live stream of a football match, and mixes together the audio signals received within the time window other than audio signals received before and after the time window. The mixer server 1520 may determine the time window by analyzing distribution of a suitable variable, such as pitch or volume, of all received audio feedback, to determine a time when the event occurred, and center the time window about that time.

If audio reactions are sent with the media stream, this guarantees that the audio will not be transmitted before the media. However if audio reactions are sent as a separate stream, then it is important that the reaction is not played before the corresponding media. In some embodiments, the time stamp of the reaction is compared against the time stamp of the currently playing media via the client device or media server 1520. If the reaction is too early, the audio stream associated with the reaction is delayed until the proper timing in the media.

In normal media and messaging clients, it is important that listeners can understand what is said. Because of that, techniques have been developed to correct errors so that the audio is of sufficient quality to be understood. Often buffering and retransmissions are employed to increase signal quality. Some of these techniques can delay the transmission.

In virtual events, it is not important that the crowd is understood, but it is important that the reactions be relatively synchronized to the event. In some embodiments, faster, simpler protocols, such as UDP are employed by the mixer server 1520. In some embodiments, audio packets that are packetized past a predetermined cutoff time, or audio packets which are lost, are ignored and not mixed. In such embodiments, if a packet is lost, a volume of adjoining packets can be smoothed so that the lost packet is not apparent.

In various embodiments, once the mixer server 1520 receives the audio streams, the mixer server 1520 may also remove any audio that is received with too much delay. If there are sufficient streams that are not too late, the mixer server 1520 may prioritize the most up-to-date streams, so that the mixer server 1520 sends out a mix or mixes with relatively up-to-date audio responses.

Other methods may also be useful for prioritization, besides timeliness. the mixer server 1520 may rate clients or users by importance, which the mixer server 1520 uses to increase or decrease a volume associated with the audio stream from each client, or, to remove or ignore the audio stream partially or entirely. The mixer server 1520 sets the importance of each client by any suitable and relevant factors, such as ticket cost, fame of the user, etc.

In certain embodiments, clients may pay to be heard, with cash, points, or virtual gifts. These payments may enable entry, for some time period, into a virtual VIP room, that can be heard by the performers, or enable a certain amount of time to talk to the audience.

In some embodiments, if a broadcaster that is recording the live event pauses live mode or temporarily stops streaming, the broadcast will be frozen. In such examples, in some embodiments designed for feedback, the audience participation can continue over the paused video.

Furthermore, embodiments of the present disclosure incorporate layering of audio for scaling and moderation.

When creating audio for a virtual space shared with many participants there may be additional considerations for voice, besides whether users are in the same virtual room, or nearby each other in virtual space.

In some implementations of large audio environments, the mixer server 1520 uses a system of layering to separate and balance various audio signals. In one implementation, the mixer server 1520 divides up participants into several audio layers, for instance: "my room's audio," "the announcer's audio," "the crowd's (the other rooms') audio," and the "event audio" feed. Through either manual controls, like a mixing panel, or through an automatic process, the volumes of each layer is balanced.

In one implementation, the mixer server 1520 sets the audio levels of each layer, and each user, via the client device, may further adjust the audio levels. Each layer may be encoded or transmitted separately so that the volume of each layer can be adjusted separately.

Embodiments of the present disclosure further adjust for various types of received audio input stream from the plurality of terminals 1530. For example, one or more of the audio input streams may be too loud, have bad feedback, or even contain offensive speech or noise. Before various audio channels are mixed together by the mixer server 1520, standard techniques may be implemented to detect for feedback or adjust volume, and mute bad audio inputs. Standard techniques can be used to convert speech into text, and check for offensive language. In one implementation, suspect audio signals are recorded, time stamped, marked to indicate which user or client transmitted the audio signal. Other useful metadata, like the text of the message, may be recorded as well. Suspect signals can be examined, in bulk or one at a time, manually or automatically. For instance, the mixer server 1520 may employ a binary search technique. For instance, sixteen channels of audio can be mixed together and listened to. If a problem in one or more of the channels is detected, the group of sixteen channels is split into two groups of eight, or otherwise divided into separate smaller groups, for further checking. If the mixer server 1520 identifies a problem with one of the groups of eight, the identified group is again divided into two groups, e.g. groups of four signals. The dividing process is continued until the problematic audio stream is identified and eliminated by the mixer server 1520.

Figure 16:
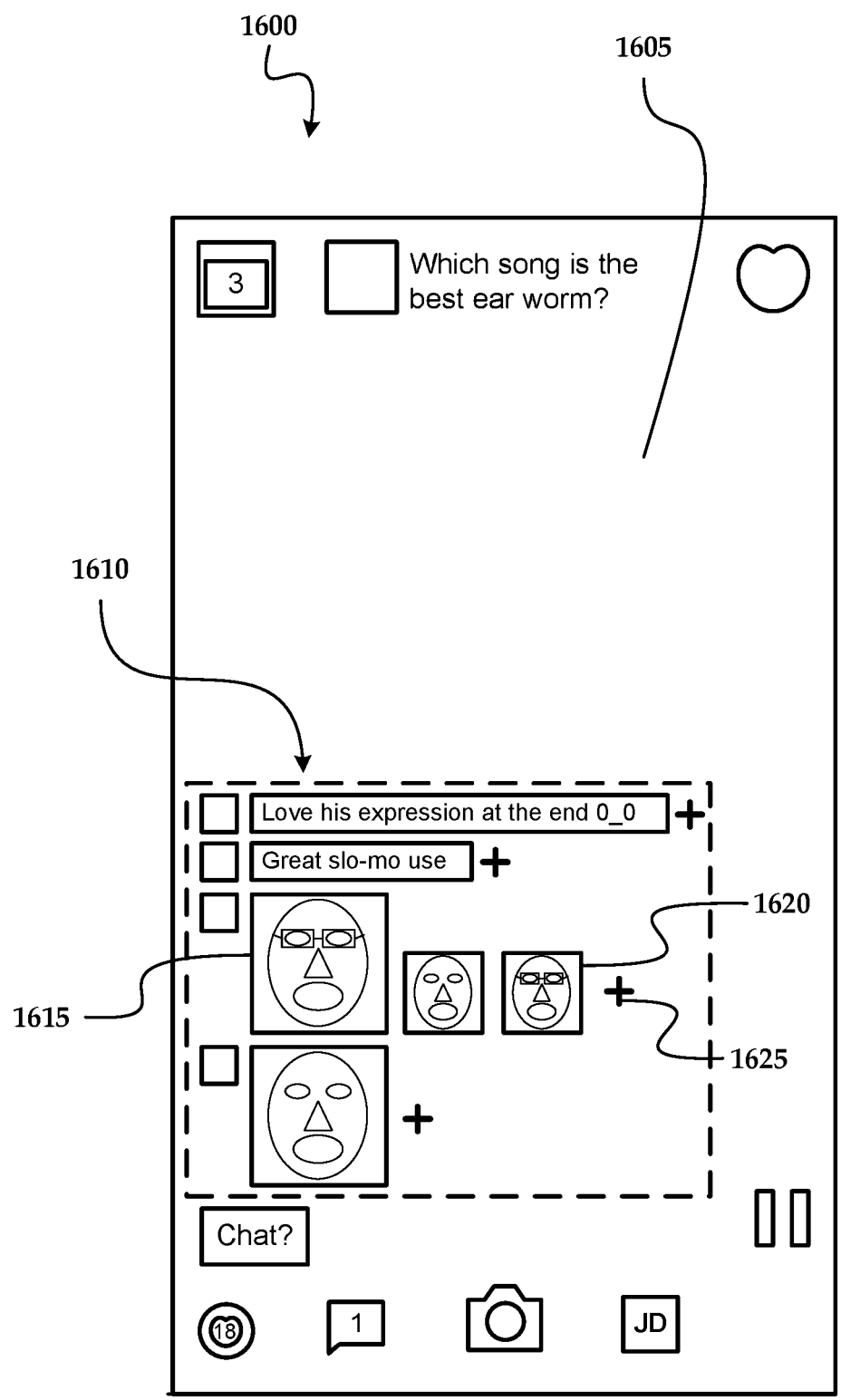
FIG. 16 illustrates a graphical user interface 1600 for implementing reaction to reaction chat overlays, according to the present disclosure.

FIG. 16 illustrates a graphical user interface 1600 for implementing reaction to reaction chat overlays. In one implementation, picture in picture responses are arranged like standard text chat, vertically, from oldest on top, to newest on bottom, as shown in the chat overlay 315 in FIG. 6. To go forward in a discussion, a user may scroll, gesture or select downwards. To go backwards in a discussion, the user may scroll, gesture or select upwards.

A linear arrangement of responses, however, may make it difficult to place a response anywhere besides the location after the last response. A linear arrangement may be appropriate if the response is intended to continue the discussions created by the list of responses. However, sometimes users may want to respond, not to the whole thread of messages, but to a particular message. When users wish to respond to a particular message, the standard technique is called a threaded discussion, or conversation threading.

Various embodiments of the present disclosure enable video discussions or reactions to have responses, not just at an end of the list, but also responses to responses or reactions to reactions. For example, the graphical user interface 1600 may comprise an underlying media item 1605, a chat overlay 1610, a reaction video 1615, and a plurality of reactions 1620 to the reaction video 1615. Instead of displaying a linear list of responses, responses to the response are displayed horizontally, such as reactions 1620.

In one or more embodiments, gestures, buttons or other suitable user input are generated to distinguish between a user response 'at the end' of a chat thread or a response to a specific item or reaction. For example, the graphical user interface 1600 may comprise a button 1625 for facilitating associating a new response or reaction to a particular response or reaction in the chat overlay 1610. In response to receiving the user input by a user actuating 1625, or otherwise touching/clicking a predetermined area adjacent to or over the response, or other suitable user input, a new response or reaction is created and associated with the corresponding response or reaction.

Depending on which button 1625 the user actuates, the response will be displayed in the location of the button 1625.

Figure 17:
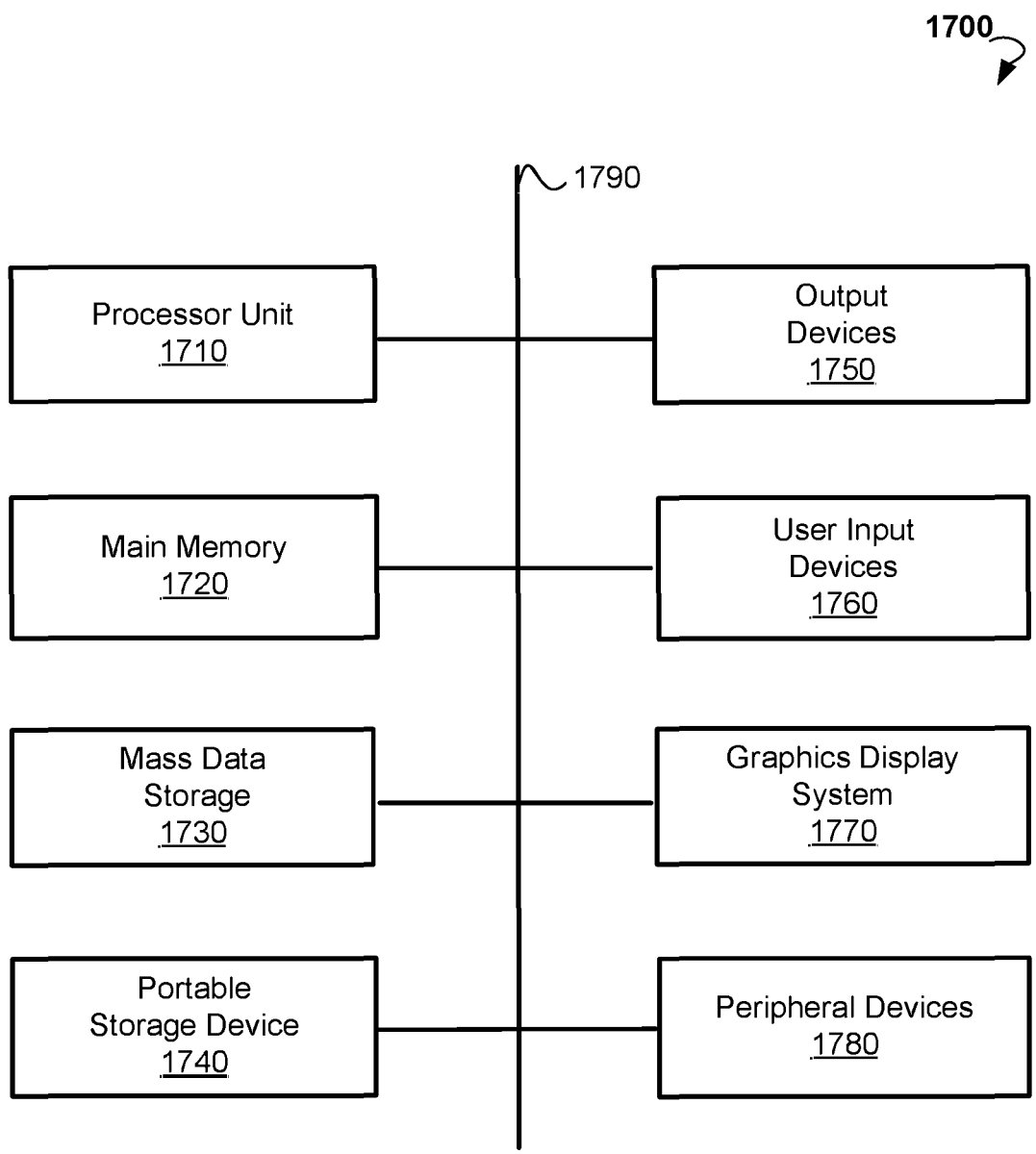
FIG. 17 illustrates an exemplary computer system that may be used to implement some or all embodiments of the system.

FIG. 17 illustrates an exemplary computer system 1700 that may be used to implement some embodiments of the present invention. The computer system 1700 of FIG. 17 may be implemented in the contexts of the likes of computing systems, networks, servers, or combinations thereof. The computer system 1700 of FIG. 17 includes one or more processor units 1710 and main memory 1720. Main memory 1720 stores, in part, instructions and data for execution by processor units 1710. Main memory 1720 stores the executable code when in operation, in this example. The computer system 1700 of FIG. 17 further includes a mass data storage 1730, portable storage device 1740, output devices 1750, user input devices 1760, a graphics display system 1770, and peripheral devices 1780.

The components shown in FIG. 17 are depicted as being connected via a single bus 1790. The components may be connected through one or more data transport means. Processor unit 1710 and main memory 1720 is connected via a local microprocessor bus, and the mass data storage 1730, peripheral device(s) 1780, portable storage device 1740, and graphics display system 1770 are connected via one or more input/output (I/O) buses.

[Mass data storage 1730, which can be implemented with a magnetic disk drive, solid state drive, or an optical disk drive, is a non-volatile storage device for storing data and instructions for use by processor unit 1710. Mass data storage 1730 stores the system software for implementing embodiments of the present disclosure for purposes of loading that software into main memory 1720.

Portable storage device 1740 operates in conjunction with a portable non-volatile storage medium, such as a flash drive, floppy disk, compact disk, digital video disc, or Universal Serial Bus (USB) storage device, to input and output data and code to and from the computer system 1700 of FIG. 17. The system software for implementing embodiments of the present disclosure is stored on such a portable medium and input to the computer system 1700 via the portable storage device 1740.

User input devices 1760 can provide a portion of a user interface. User input devices 1760 may include one or more microphones, an alphanumeric keypad, such as a keyboard, for inputting alphanumeric and other information, or a pointing device, such as a mouse, a trackball, stylus, or cursor direction keys. User input devices 1760 can also include a touchscreen. Additionally, the computer system 1700 as shown in FIG. 17 includes output devices 1750. Suitable output devices 1750 include speakers, printers, network interfaces, and monitors.

Graphics display system 1770 include a liquid crystal display (LCD) or other suitable display device. Graphics display system 1770 is configurable to receive textual and graphical information and processes the information for output to the display device.

Peripheral devices 1780 may include any type of computer support device to add additional functionality to the computer system.

The components provided in the computer system 1700 of FIG. 17 are those typically found in computer systems that may be suitable for use with embodiments of the present disclosure and are intended to represent a broad category of such computer components that are well known in the art. Thus, the computer system 1700 of FIG. 17 can be a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, TIZEN, and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accord with the technology. Those skilled in the art are familiar with instructions, processor(s), and storage media.

In some embodiments, the computing system 1700 may be implemented as a cloud-based computing environment, such as a virtual machine operating within a computing cloud. In other embodiments, the computing system 1700 may itself include a cloud-based computing environment, where the functionalities of the computing system 1700 are executed in a distributed fashion. Thus, the computing system 1700, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud is formed, for example, by a network of web servers that comprise a plurality of computing devices, such as the computing device 1700, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participate in providing instructions to a CPU for execution. Such media can take many forms, including, but not limited to, non-volatile media, volatile media and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications. Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the invention in the form disclosed. Many modifications and variations will be apparent to those of ordinary skill in the art without departing from the scope and spirit of the invention. Exemplary embodiments were chosen and described in order to best explain the principles of the present technology and its practical application, and to enable others of ordinary skill in the art to understand the invention for various embodiments with various modifications as are suited to the particular use contemplated.

Aspects of the present technology are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams illustrate the architecture, functionality, and operation of possible implementations of systems, methods and computer program products according to various embodiments of the present technology. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments. It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

What is claimed is:

1. A computer-implemented method, comprising:
receiving a plurality of audio reactions from a plurality of client devices, the audio reactions being captured by microphones on the client devices and being time-stamped;
mixing the audio reactions by a mixer server to form a mixed audio reaction;
sending the mixed audio reaction to at least one of the client devices, the client device adapted to play the mixed audio reaction and a mass media presentation, the mixed audio reaction and the mass media presentation being synchronized to create an audience effect for the mass media presentation;
performing echo removal, volume balancing, compression, and time stamping of an audio stream by the client device;
receiving reactions from at least one of buttons and gestures to activate synthesized sounds, the synthesized sounds including clapping, booing, and cheering; and
mixing the synthesized sounds into the mixed audio reaction by at least one of mixer server and the client device;
wherein, when the synthesized sounds are mixed into the mixed audio reaction by the mixer server, the mixer server creates a crowd mix by combining the audio reactions and the synthesized sounds and transmits the crowd mix to the client devices that have selected to play the audience effect; and
wherein, when the synthesized sounds are mixed into the mixed audio reaction by the client device, a count of the synthesized sounds and the mixed audio reaction is transmitted to the client devices that have selected to play the audience effect.

2. A computer-implemented method, comprising:
receiving a plurality of audio reactions from a plurality of client devices, the audio reactions being captured by microphones on the client devices and being time-stamped;
mixing the audio reactions by a mixer server to form a mixed audio reaction;
sending the mixed audio reaction to at least one of the client devices, the client device adapted to play the mixed audio reaction and a mass media presentation, the mixed audio reaction and the mass media presentation being synchronized to create an audience effect for the mass media presentation;
associating a subset of client devices to form a friend group, the subset of client devices being selected for association based on at least one of a first proximity between users of the client devices in a virtual stadium and a second proximity between users of the client devices in a social graph indicating strength of relationship;
receiving by the client devices of the friend group audio reactions from other client devices of the friend group;
enabling adjustment of a first volume of the other client devices of the friend group, a second volume of the mixed audio reaction, and a third volume of the mass media presentation; and
controlling a number of the subset of client devices forming the friend group to below a maximum number to enable users of the subset of client devices to talk to each other over the audience effect.

3. The computer-implemented method of claim 2, further comprising:
dividing, by the mixer server, the virtual stadium of client devices into two or more mixes; and
mixing separately an audio reaction of the client device and other client devices of the virtual room of the client device; and
combining the audio reaction of the other client devices of the virtual room of the client device and audio reaction mixes of other virtual rooms to produce an audience reaction mix of the virtual stadium excluding the audio reaction from the client device.

4. The computer-implemented method of claim 3, further comprising:
generating a graphical user interface by a client device, the graphical user interface having one or more indicators and one or more controls for a volume of at least one of the virtual stadium, a virtual room, and a synthesized sound;
providing a selector for automatically balancing the audio mix comprising lowering the virtual stadium sounds to ensure that priority participants are audible;
assigning by the mixer server to a user a preferred virtual room based on which virtual room most friends or acquaintances of the user are occupying;
receiving by the user an invitation from another user to another virtual room; and
recording the mass media presentation and the audience effect, the recording of the audience effect being selectable by a subsequent consumer of the mass media presentation.

5. The computer-implemented method of claim 1, further comprising:
grouping the client devices into a plurality of virtual rooms;
assigning a location in the virtual room for a user of the client device, the assigning being performed by at least one of the user and the mixer server, the location determining a speaking sound level for the user speaking and a listening sound level for the user listening; and
combining by the mixer server audio inputs from terminals of virtual participants in the same virtual room into a single virtual room audio stream, the mixer server adjusting a volume of the virtual room audio stream and transmitting the virtual room audio stream to the client devices associated with the virtual room, the mixer server adjusting the volume, stereo mix, head related transforms, and room parameters to create an effect of a real space;
wherein the user and other users of the client devices grouped into a same virtual room hear each other at a normal volume; and
wherein further users in other virtual rooms are played at a reduced volume.

6. The computer-implemented method of claim 1, further comprising:
displaying at least one of a name and an avatar of a speaker when an audio stream from the speaker is at sufficient volume to be understandable; and
enabling activation of the at least one of the name and the avatar by a user to:
obtain additional information and interfaces relating to the speaker,
review or replay the audio stream from the speaker,
have a private conversation with the speaker,
change a volume of the audio stream from the speaker,
mute a volume of the audio stream from the speaker, and
block the audio stream from the speaker.

7. The computer-implemented method of claim 1, further comprising subtracting a particular one of the audio reactions from the mixed audio reaction when the mixed audio reaction is played on a particular one of the client devices, the particular one of the audio reactions being received from the particular one of the client devices.

8. The computer-implemented method of claim 1, further comprising:
providing a plurality of audio reactions of a first set of the client devices associated with a virtual room, the first set of client devices transmitting audio reactions, the plurality of audio reactions being mixed at a particular one of the first set of the client devices without the audio reaction from the particular one of the client devices; and
providing a same virtual room mix of the first set of the client devices to a second set of the client devices associated with the virtual room, the second set of the client devices not transmitting audio reactions.

9. A computer-implemented method, comprising:
receiving a plurality of audio reactions from a plurality of client devices, the audio reactions being captured by microphones on the client devices and being time-stamped;
mixing the audio reactions by a mixer server to form a mixed audio reaction;
sending the mixed audio reaction to at least one of the client devices, the client device adapted to play the mixed audio reaction and a mass media presentation, the mixed audio reaction and the mass media presentation being synchronized to create an audience effect for the mass media presentation;
associating the client devices with a plurality of virtual rooms;
splitting the virtual rooms into two or more virtual sub-rooms;
sending by the mixer server an audio reaction sub-room mix of a first sub-room of the virtual room that does not include an audio reaction of a user;
sending by the mixer server a plurality of audio reactions of client devices of a second sub-room of the virtual room that does include an audio reaction of the user; and
mixing by the client device the audio reaction sub-room mix of the first sub-room and the plurality of audio reactions of the client devices of the second sub-room excluding the audio reaction of the user.

10. The computer-implemented method of claim 9, further comprising:
positioning users in a virtual space so that nearby virtual rooms or participants can be spatialized using spatialization techniques;
treating users associated with other rooms as simple ambient mixes;
selecting by a user a position within a virtual room, the position being at least one of a virtual empty seat and a virtual proximate position with respect to another user, the selection being transmitted to the mixer server; and
mixing separately by the mixer server an audio stream associated with the user based on the selection.

11. The computer-implemented method of claim 9, further comprising:
providing a graphical user interface for a user to select to hear certain users and to mute other certain users; and
selecting by an event producer to mute at least one of further certain users, groups of virtual rooms, and particular virtual rooms.

12. The computer-implemented method of claim 9, further comprising:
assigning by the mixer server a user to a virtual room containing a highest number of friends of the user; and collecting by the mixer server a highest rated content from a plurality of virtual rooms; and promoting the highest rated content to other virtual rooms.

13. The computer-implemented method of claim 9, further comprising:

determining a time window for cutoff of audio reactions by analyzing a distribution of at least one of pitch and volume of the audio reactions;

wherein the mixing of the audio reactions by the mixer server to form the mixed audio reaction does not include audio reactions received after the time window.

14. The computer-implemented method of claim 9, further comprising:

increasing a volume of one of the audio reactions in the mixed audio reaction by the mixer server based on at least one of a ticket cost, a fame of the user, a payment, a point allocation, and a virtual gift;

enabling a live performer to hear one of the audio reactions based on the user presence in a virtual VIP room; and continuing to form the mixed audio reaction when the mass media presentation one of stops or pauses.

15. The computer-implemented method of claim 9, wherein:

the mixed audio reaction includes a plurality of layers, a corresponding volume level for each of the layers being separately controlled relative to the other layers; and the sending of the mixed audio reaction to the at least one of the client devices includes sending a virtual room layer corresponding to a virtual room of the client device, an announcer layer corresponding to an audio of an announcer, a crowd audio corresponding to a mix of the virtual rooms excluding the virtual room of the client device, and a mass media audio corresponding to the mass media presentation.

16. The computer-implemented method of claim 9, further comprising:

detecting for feedback and offensive noises in the plurality of audio reactions;

converting speech to text in the plurality of audio reactions to check for offensive language; and adjusting a volume of ones of the audio reactions having at least one of feedback, offensive noises, and offensive language, the adjusting including reducing and muting.

17. A system, comprising:

a receiving module adapted to receive a plurality of audio reactions from a plurality of client devices, the audio reactions being captured by microphones on the client devices and being time-stamped, the client devices performing echo removal, volume balancing, compression, and time stamping of the audio stream by the client device, the client devices receiving reactions from at least one of buttons and gestures to activate synthesized sounds, the synthesized sounds including clapping, booing, and cheering;

a mixer server adapted to mix the audio reactions to form a mixed audio reaction, the mixer server further mixing the synthesized sounds into the mixed audio reaction to create a crowd mix by combining the audio reactions and the synthesized sounds, the mixer server associating a subset of client devices to form a friend group, the subset of client devices being selected for association based on at least one of a first proximity between users of the client devices in a virtual stadium space and a second proximity between users of the client devices in a social graph indicating strength of relationship; and a transmitter adapted to send the mixed audio reaction to at least one of the client devices, the client device adapted to play the mixed audio reaction and a mass media presentation, the mixed audio reaction and the mass media presentation being synchronized to create an audience effect for the mass media presentation, the transmitter sending audio reactions to the client devices of the friend group from other client devices of the friend group to enable adjustment of a first volume of the other client devices of the friend group, a second volume of the mixed audio reaction, and a third volume of the mass media presentation;

wherein the mixer server controls a number of the subset of client devices forming the friend group to below a maximum number to enable users of the subset of client devices to talk to each other over the audience effect.

18. The system of claim 17, wherein:

the mixer server groups the client devices into a plurality of virtual rooms and assigns a location in the virtual room for a user of the client device, the assigning being performed by at least one of the user and the mixer server, the location determining a speaking sound level for the user speaking and a listening sound level for the user listening;

the mixer server combines audio inputs from terminals of virtual participants in the same virtual room into a single virtual room audio stream, the mixer server adjusting a volume of the virtual room audio stream and transmitting the virtual room audio stream to the client devices associated with the virtual room;

the volume, stereo mix, head related transforms, and room parameters are adjusted to create an effect of a virtual room;

the user and other users of the client devices grouped into a same virtual room hear each other at a normal volume; and further users in other virtual rooms are played at a reduced volume.

19. The system of claim 17, further comprising:

a display adapted to display at least one of a name and an avatar of a speaker when an audio stream from the speaker is at sufficient volume to be understandable;

wherein the display enables activation of the at least one of the name and the avatar by a user to:

obtain additional information and interfaces relating to the speaker, review or replay the audio stream from the speaker, have a private conversation with the speaker, change a volume of the audio stream from the speaker, mute a volume of the audio stream from the speaker, and block the audio stream from the speaker.

* * * * *